(12) United States Patent
Kushta

(10) Patent No.: US 8,970,327 B2
(45) Date of Patent: Mar. 3, 2015

(54) FILTER BASED ON A COMBINED VIA STRUCTURE

(75) Inventor: Taras Kushta, Tokyo (JP)

(73) Assignee: NEC Corporation, Tokyo (JP)

( * ) Notice: Subject to any disclaimer, the term of this patent is extended or adjusted under 35 U.S.C. 154(b) by 728 days.

(21) Appl. No.: 13/139,786

(22) PCT Filed: Dec. 25, 2008

(86) PCT No.: PCT/JP2008/073942
§ 371 (c)(1),
(2), (4) Date: Jun. 15, 2011

(87) PCT Pub. No.: WO2010/073410
PCT Pub. Date: Jul. 1, 2010

(65) Prior Publication Data
US 2011/0248800 A1    Oct. 13, 2011

(51) Int. Cl.
*H01P 1/203* (2006.01)
*H01P 7/08* (2006.01)
(Continued)

(52) U.S. Cl.
CPC ............... *H01P 1/2056* (2013.01); *H01P 1/203* (2013.01); *H01P 7/08* (2013.01); *H01P 7/04* (2013.01); *H05K 1/0251* (2013.01); *H05K 1/0222* (2013.01); *H05K 1/116* (2013.01); *H05K 3/429* (2013.01); *H05K 2201/09454* (2013.01); *H05K 2201/09618* (2013.01); *H05K 2201/09627* (2013.01); *H05K 2201/09718* (2013.01)
USPC ........................... 333/204; 333/219

(58) Field of Classification Search
USPC .................. 333/204, 219, 238, 246
See application file for complete search history.

(56) References Cited

U.S. PATENT DOCUMENTS

| 5,932,522 A | 8/1999 | Bell et al. |
| 6,091,312 A * | 7/2000 | Sheen ............. 333/176 |

(Continued)

FOREIGN PATENT DOCUMENTS

| CN | 1747225 A | 3/2006 |
| JP | 10-303618 A | 11/1998 |

(Continued)

OTHER PUBLICATIONS

Chinese Office Action for CN Application No. 200880132513.0 issued on May 31, 2013 with English Translation.

(Continued)

*Primary Examiner* — Robert Pascal
*Assistant Examiner* — Gerald Stevens
(74) *Attorney, Agent, or Firm* — Sughrue Mion, PLLC

(57) ABSTRACT

A filter is provided with a planar transmission line and a combined via structure connected to (both) one ends of the planar transmission line. The planar transmission line and the combined via structure are disposed in a same multilayer board. The combined via structure comprises two working parts. The first working part comprises a segment of signal via and a plurality of segments of ground vias surrounding the signal via. The second working part comprises a segment of the same signal via, a plurality of segments of the same ground vias, smooth conductive plate and corrugated conductive plate. The smooth conductive plate and the corrugated conductive plate are connected to the signal via. The second working part comprises a segment of the same signal via, a plurality of segments of the same ground vias and corrugated conductive plate. The corrugated conductive plate is connected to the signal via.

20 Claims, 54 Drawing Sheets

(51) Int. Cl.
*H01P 1/205* (2006.01)
*H01P 7/04* (2006.01)
*H05K 1/02* (2006.01)
*H05K 1/11* (2006.01)
*H05K 3/42* (2006.01)

(56) References Cited

U.S. PATENT DOCUMENTS 6,566,985 B2 5/2003 Niiranen et al.
6,903,632 B2 6/2005 Hashimoto et al.

FOREIGN PATENT DOCUMENTS

| JP | 2004120659 A | 4/2004 |
| JP | 2008507858 A | 3/2008 |
| WO | 2006009274 A | 1/2006 |
| WO | 2008/051572 A1 | 5/2008 |

OTHER PUBLICATIONS

International Search Report for PCT/JP2008/073942 mailed Apr. 14, 2009.

* cited by examiner

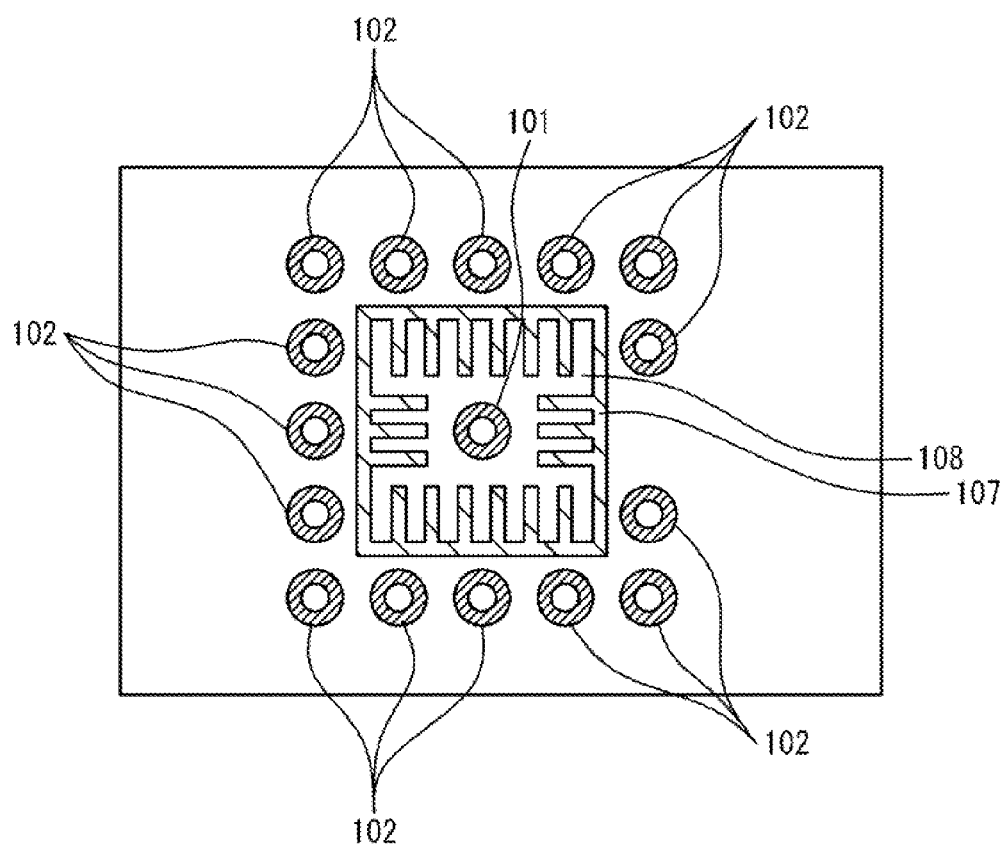

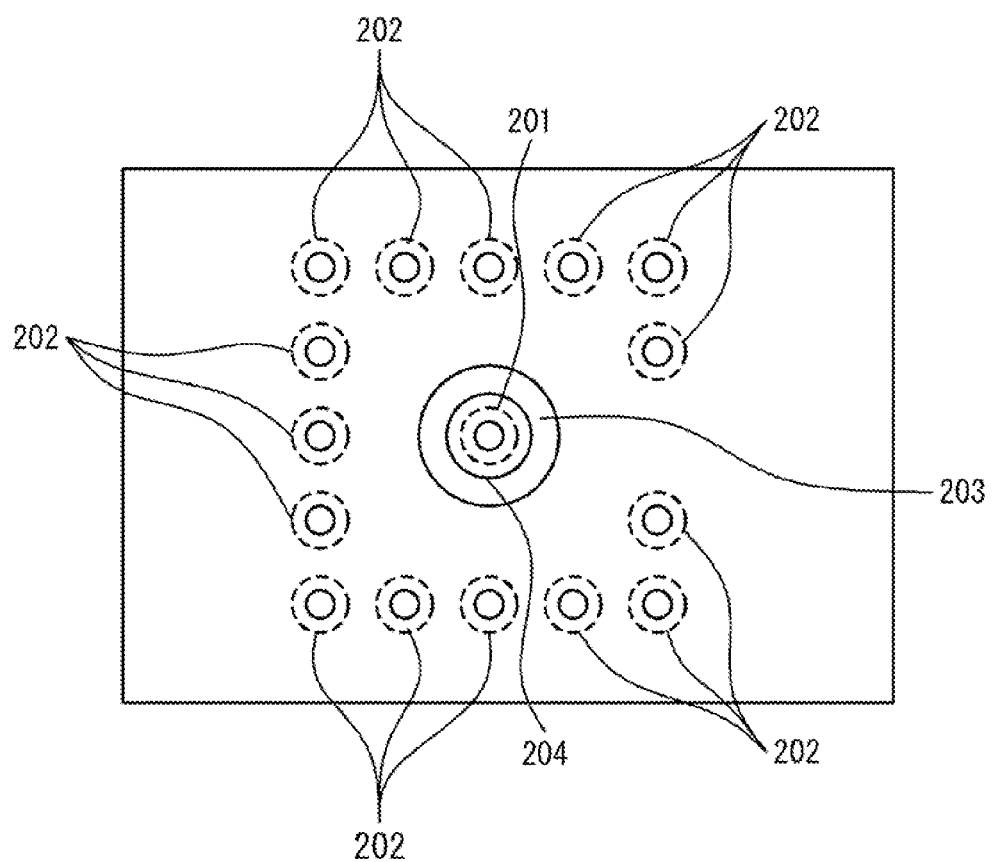

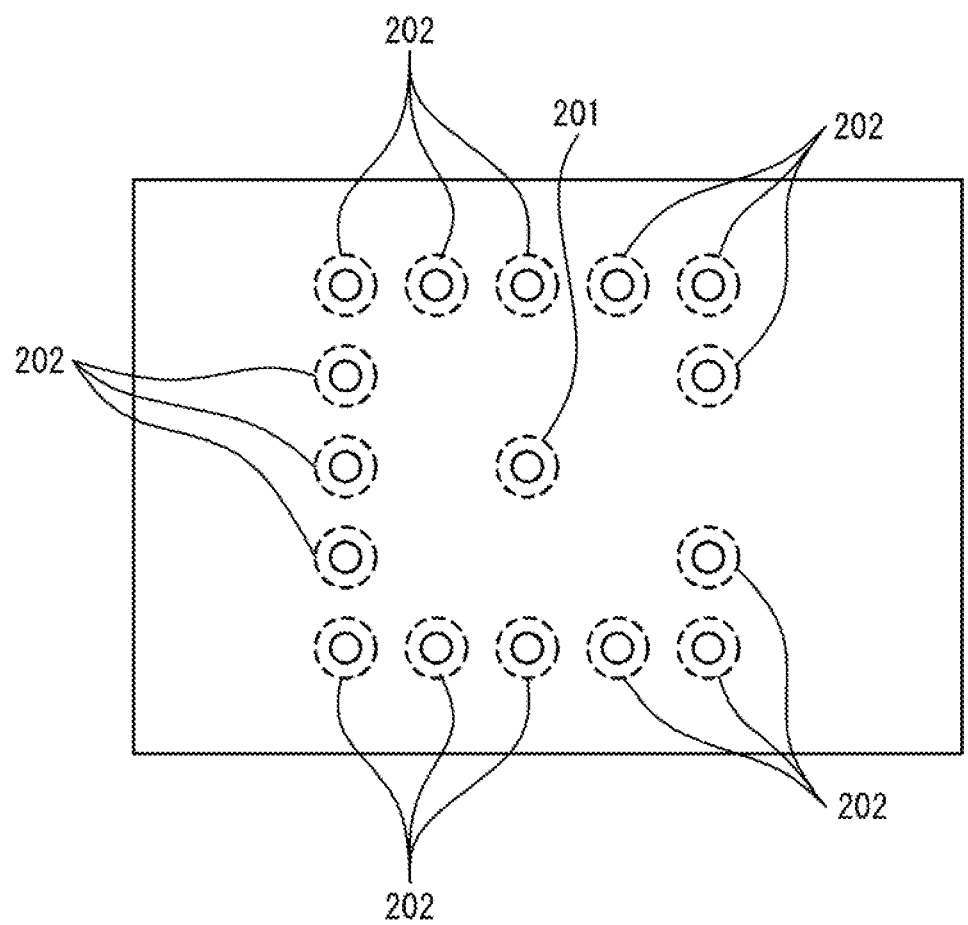

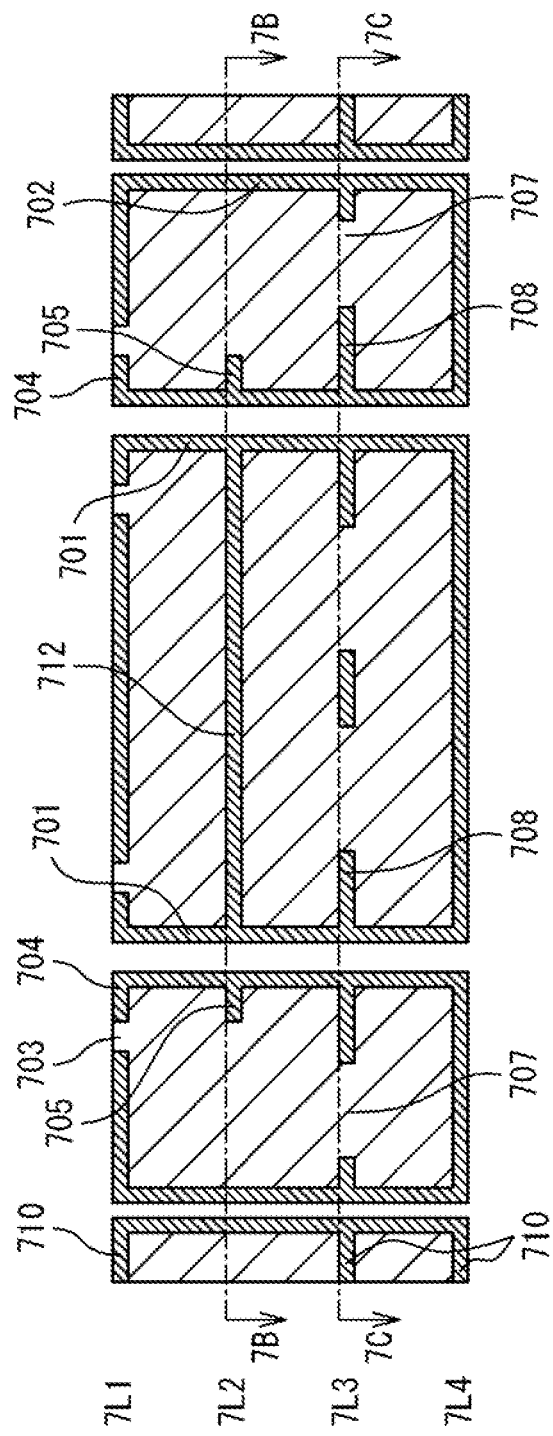

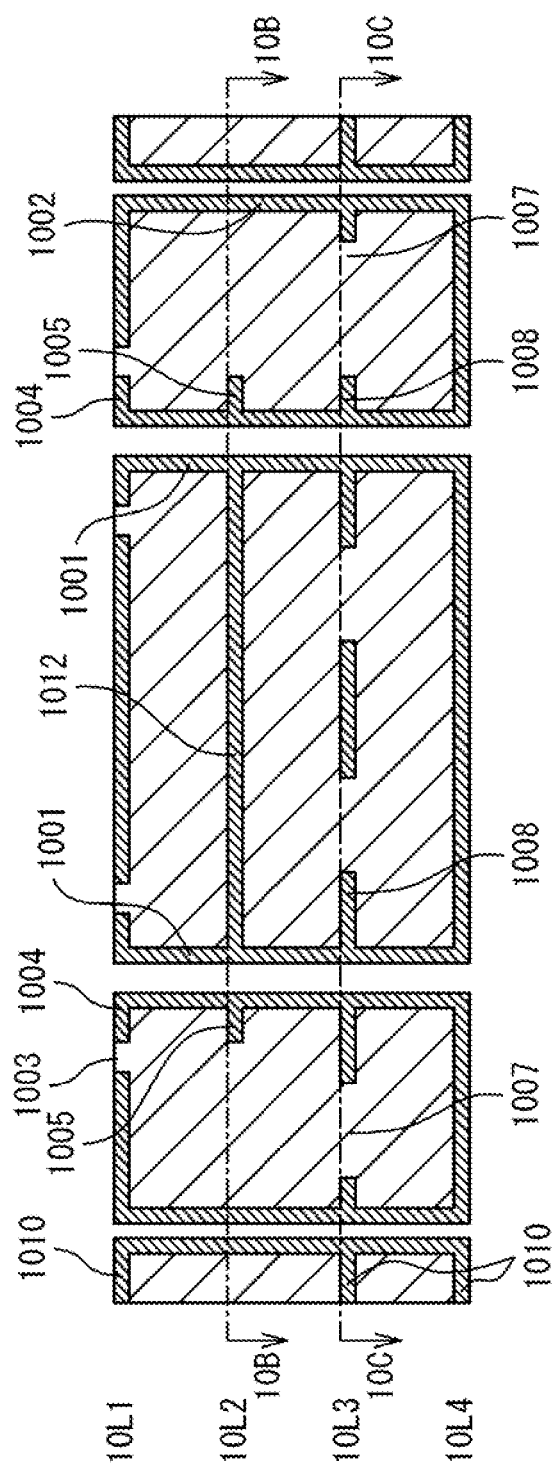

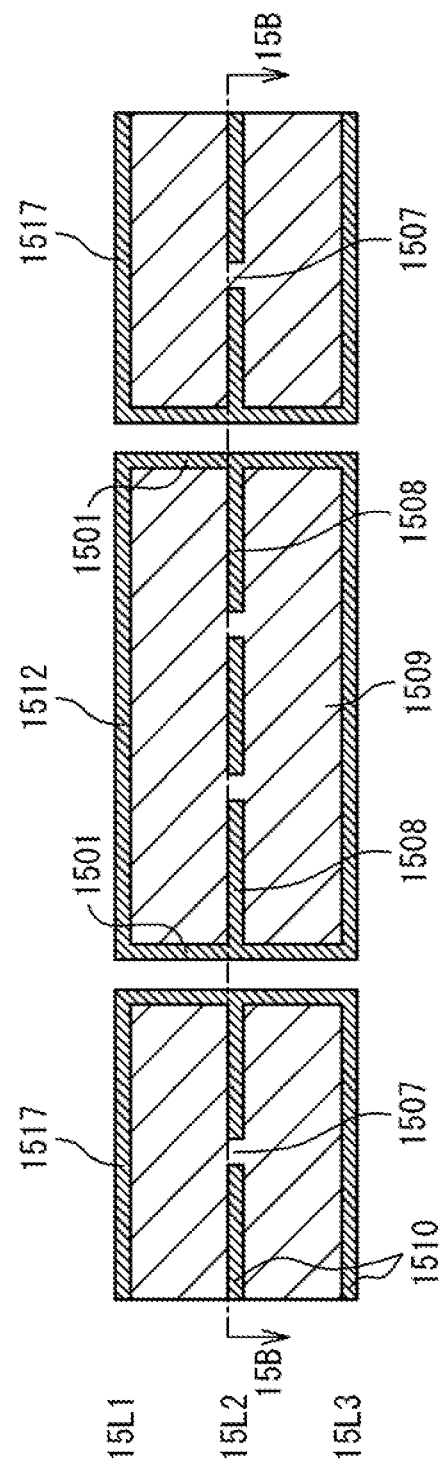

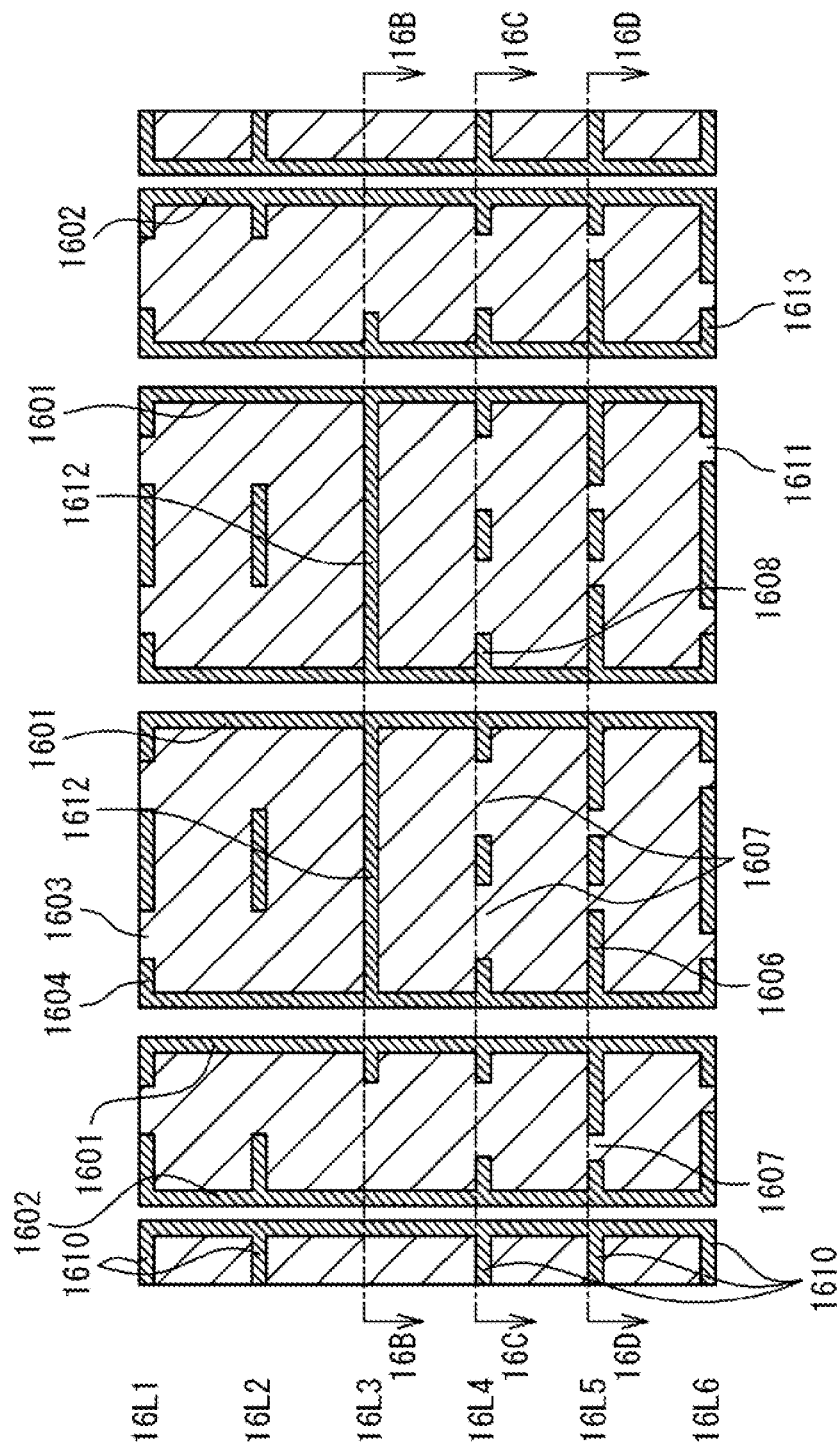

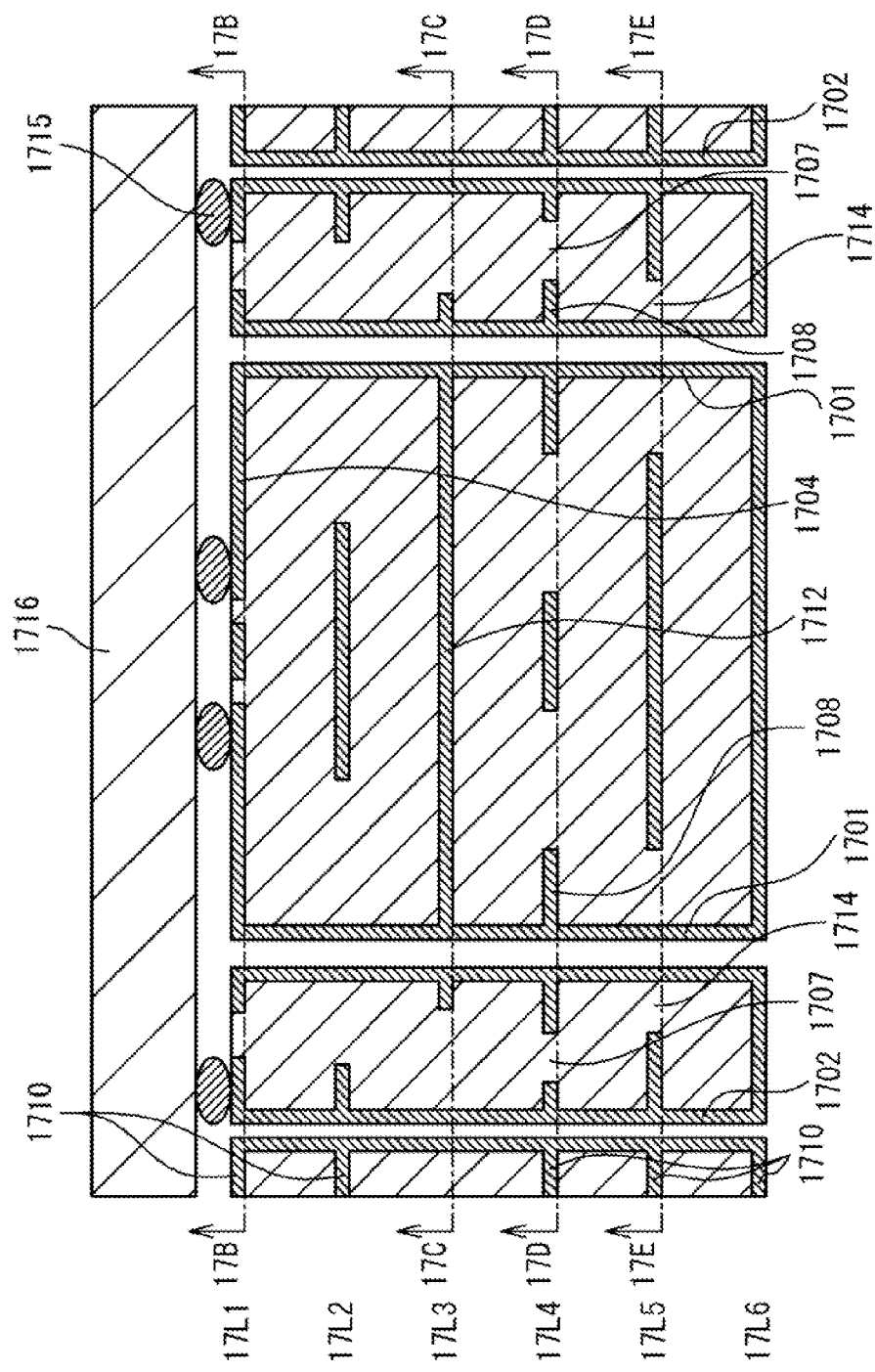

FILTER BASED ON A COMBINED VIA STRUCTURE

This application is the National Phase of PCT/JP2008/073942, filed Dec. 25, 2008.

TECHNICAL FIELD

The present invention relates to via structures, formed in multilayer boards, and filtering components, based on the combined via structures.

BACKGROUND ART

Next generation networking and computing systems need compact and cost-effective devices to be promoted to the market. At microwave and higher frequencies, distributed-element filters and other devices are necessary. As a cost-effective approach, multilayer board technologies can be applied to design such devices. These technologies can realize a three-dimensional design concept and, as a result, improve compactness of elements forming the systems.

One type of structures, being used as a building block in distributed-element components, is resonant open-circuited and short-circuited stubs which are applied to design the components. Usually, these stubs in multilayer boards are formed as open-circuited or short-circuited planar transmission line segments. In this case, parasitic coupling, unwanted radiation and large enough dimensions can be those issues, which can arise at development of distributed-element devices.

Japanese Laid Open Application JP 2008-507858 (US 2008/0093112A1) discloses that composite via structures, used to obtain both three-dimensional open-circuited and short-circuited shield stubs, are formed in multilayer boards in which additional smooth plates connected to the signal via are used to control the characteristic impedance of the stub. Also, ground vias around the signal via structure are applied to improve the quality factor (Q-factor) of such composite via structures. Application of such composite via structures gives a possibility to form high-performance filtering components in multilayer boards.

However, in many applications, dimensional reductions of filtering structures in a multilayer board filled in a fixed material are necessary.

Also, it is important to improve sharpness of the passband and stopband in filtering components to satisfy requirements of designing systems.

DISCLOSURE OF INVENTION

It is an objective of the present invention to provide a combined via structure in a multilayer board with well-controllable characteristic impedance and propagation constant.

In an aspect of the present invention, such combined via structure is provided by disposing two working parts arranged in vertical direction (perpendicular to multilayer board conductor plane) one after another. The first working part is used for low-loss signal transmission. This working part is formed by signal and ground vias connected to ground plates which are separated by the clearance hole. In this functional part, characteristic impedance control is provided by transverse dimensions of the signal via, the distance between signal via and ground vias, and also by dimensions of the clearance hole. The second working part is applied to obtain short-circuited or open-circuited resonance stub in a multilayer board. This working part is also formed by signal and ground vias connected to ground planes. However, this working part uses specific corrugated plates connected to the signal via and separated by isolating slits from other conductors. These conductive plates give a possibility to control characteristic impedance and propagation constant of the second working part by means of their form and dimensions and achieve required resonant frequencies of the stubs. Besides that, corrugations of the side edges of the plates are used to reduce transverse dimensions of the combined via structures.

It is another objective of this invention to provide filters, using invented combined via structures in multilayer boards, and, as a result, to reduce whole transverse dimensions of the filters and their hand-pass and band-stop performances such as sharpness.

BRIEF DESCRIPTION OF DRAWINGS

FIG. 1C is a horizontal cross-sectional view of the combined via structure shown in FIG. 1A on the 1C-1C section;

FIG. 2B is a top view of the combined via structure shown in FIG. 2A;

FIG. 2E is a bottom view of the combined via structure shown in FIG. 2A;

FIG. 7A is a vertical cross-sectional view of a filter in another exemplary embodiment of the present invention;

FIG. 10A is a vertical cross-sectional view of a filter in still another exemplary embodiment of the present invention;

FIG. 15A is a vertical cross-sectional view of a filter in still another exemplary embodiment of the present invention shown in FIG. 15C on 15A-15A section;

FIG. 16A is a vertical cross-sectional view of a filter in still another exemplary embodiment of the present invention;

FIG. 17A is a vertical cross-sectional view of a filter in still another exemplary embodiment of the present invention shown in FIG. 17B on 17A-17A section;

BEST MODE FOR CARRYING OUT THE INVENTION

Figure 1A:
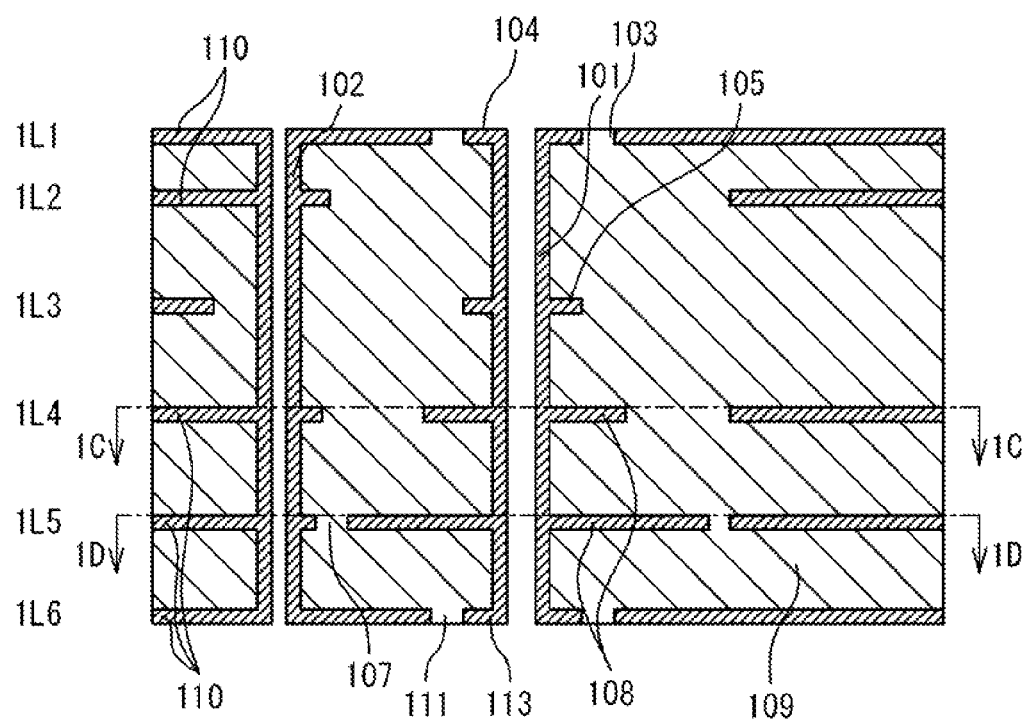
FIG. 1A is a vertical cross-sectional view illustrating a combined via structure in an exemplary embodiment of the present invention.
Figure 1B:
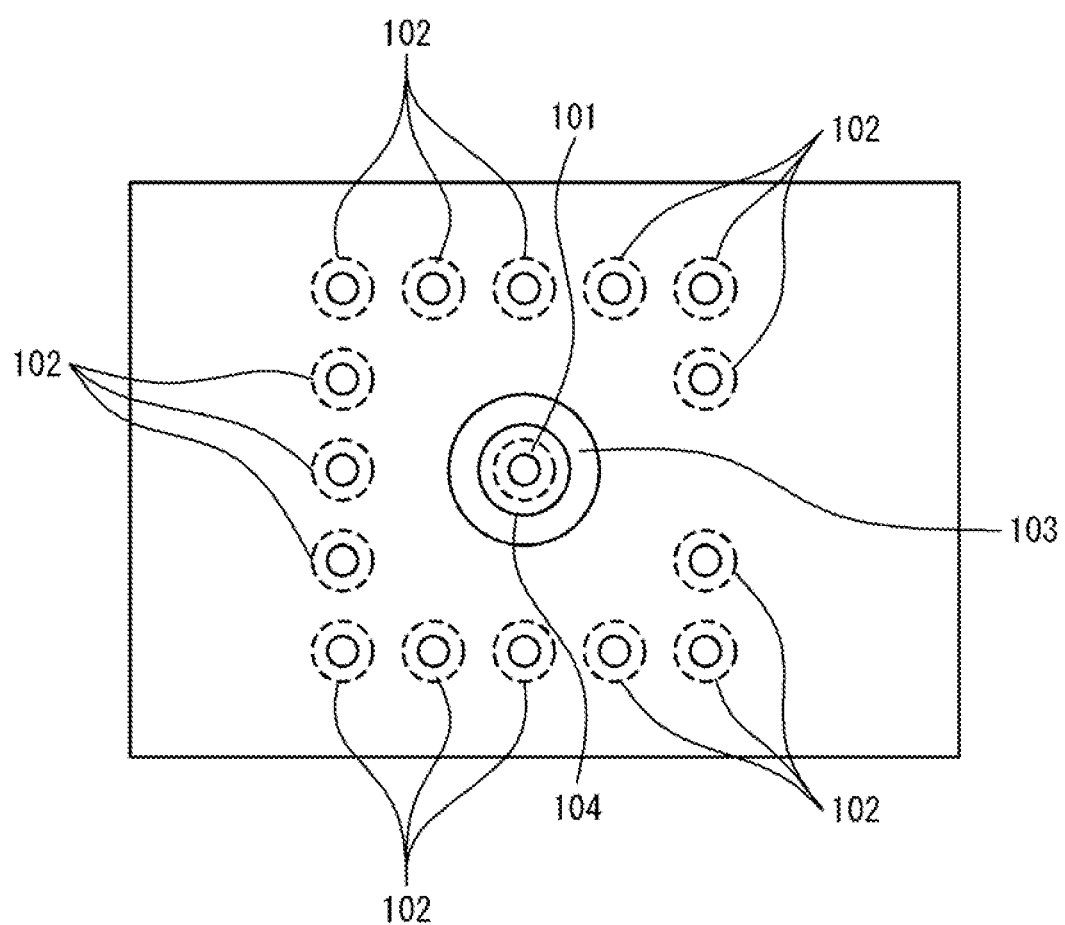
FIG. 1B is a top view of the combined via structure shown in FIG. 1A.
Figure 1D:
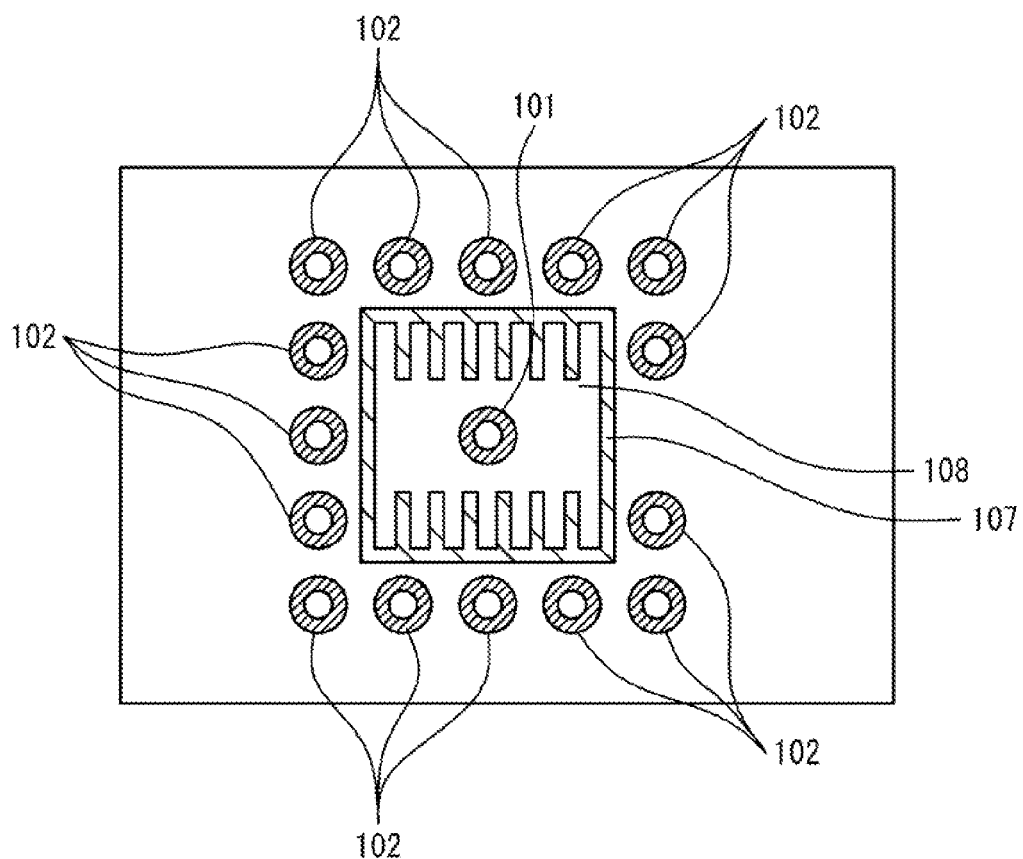
FIG. 1D is a horizontal cross-sectional view of the combined via structure shown in FIG. 1A on the 1D-1D section.
Figure 1E:
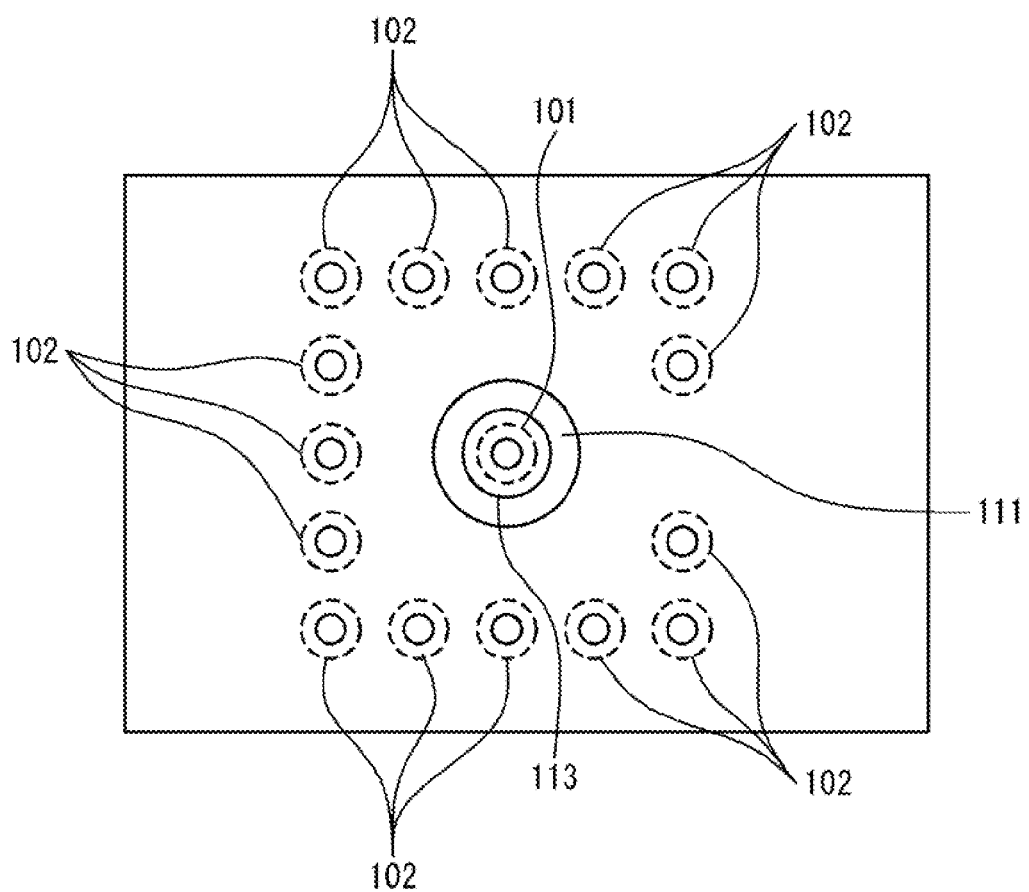
FIG. 1E is a bottom view of the combined via structure shown in FIG. 1A.
Figure 2A:
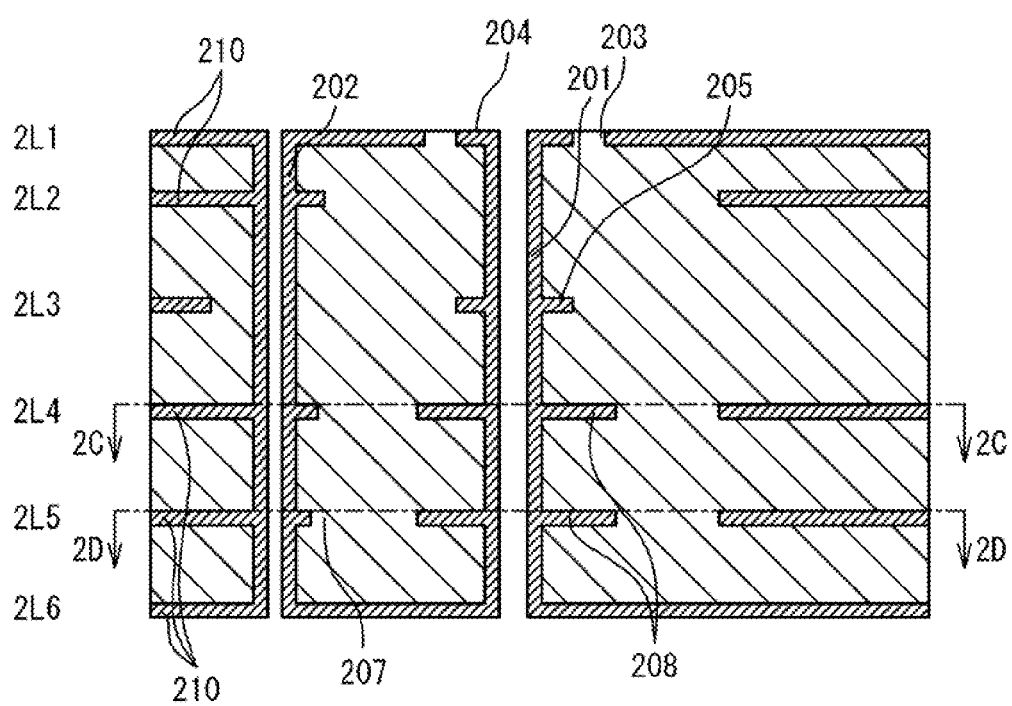
FIG. 2A is a vertical cross-sectional view illustrating a combined via structure in another exemplary embodiment of the present invention.
Figure 2C:
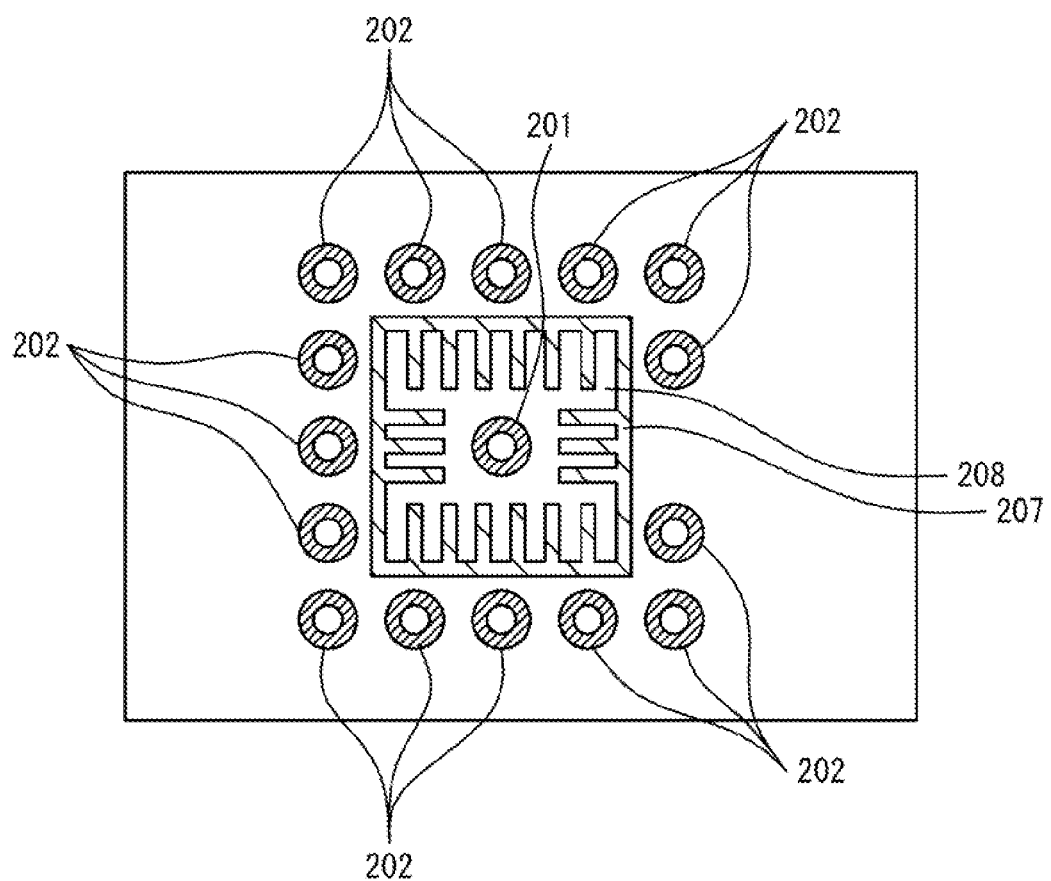
FIG. 2C is a horizontal cross-sectional view of the combined via structure shown in FIG. 2A on the 2C-2C section.
Figure 2D:
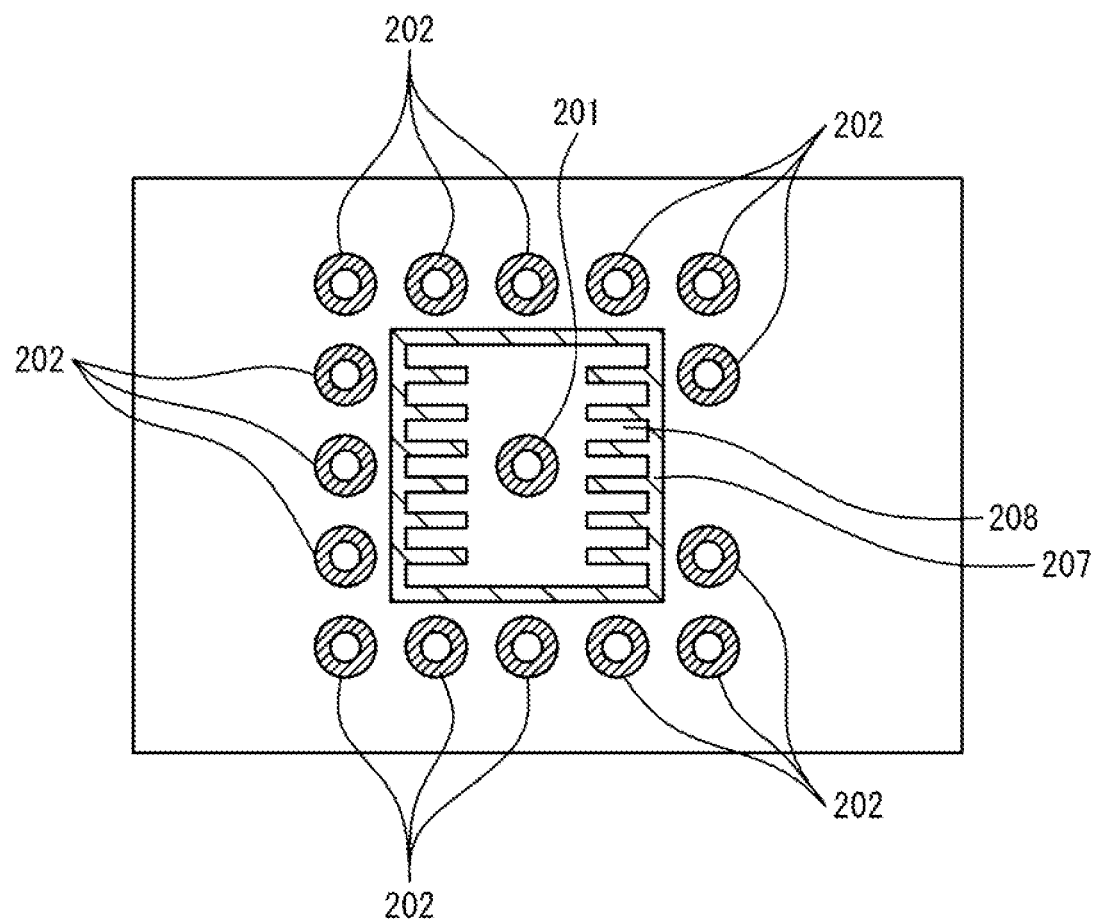
FIG. 2D is a horizontal cross-sectional view of the combined via structure shown in FIG. 2A on the 2D-2D section.
Figure 3A:
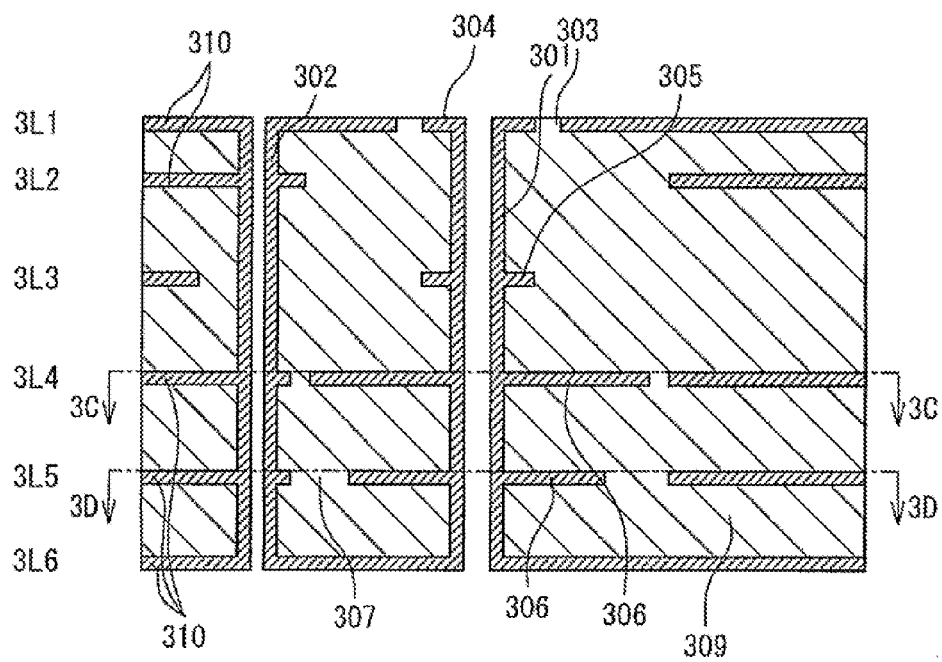
FIG. 3A is a vertical cross-sectional view illustrating a combined via structure in a relating art.
Figure 3B:
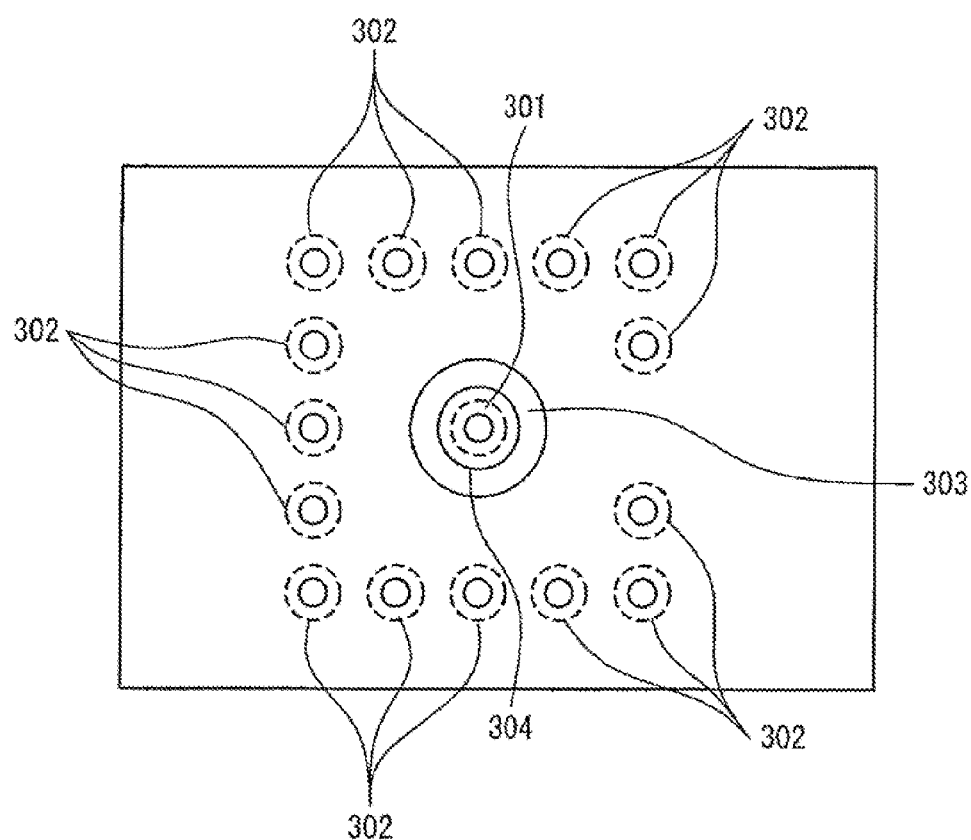
FIG. 3B is a top view of the combined via structure shown in FIG. 3A.
Figure 3C:
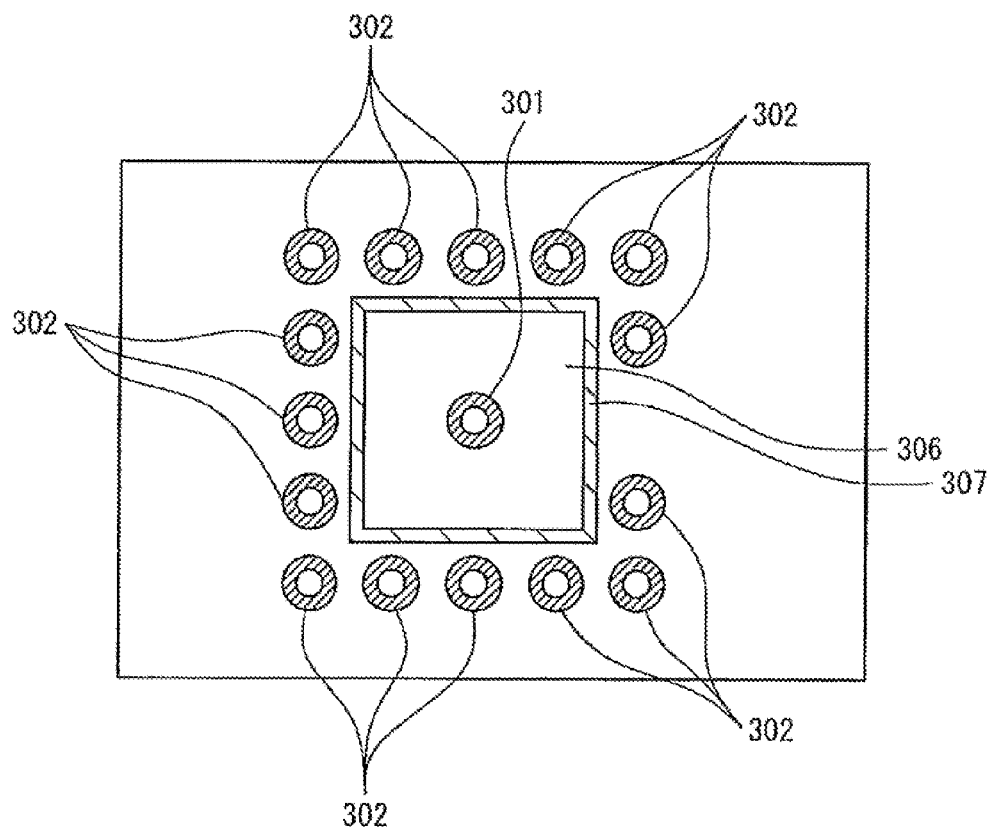
FIG. 3C is a horizontal cross-sectional view of the combined via structure shown in FIG. 3A on 3C-3C section.
Figure 3D:
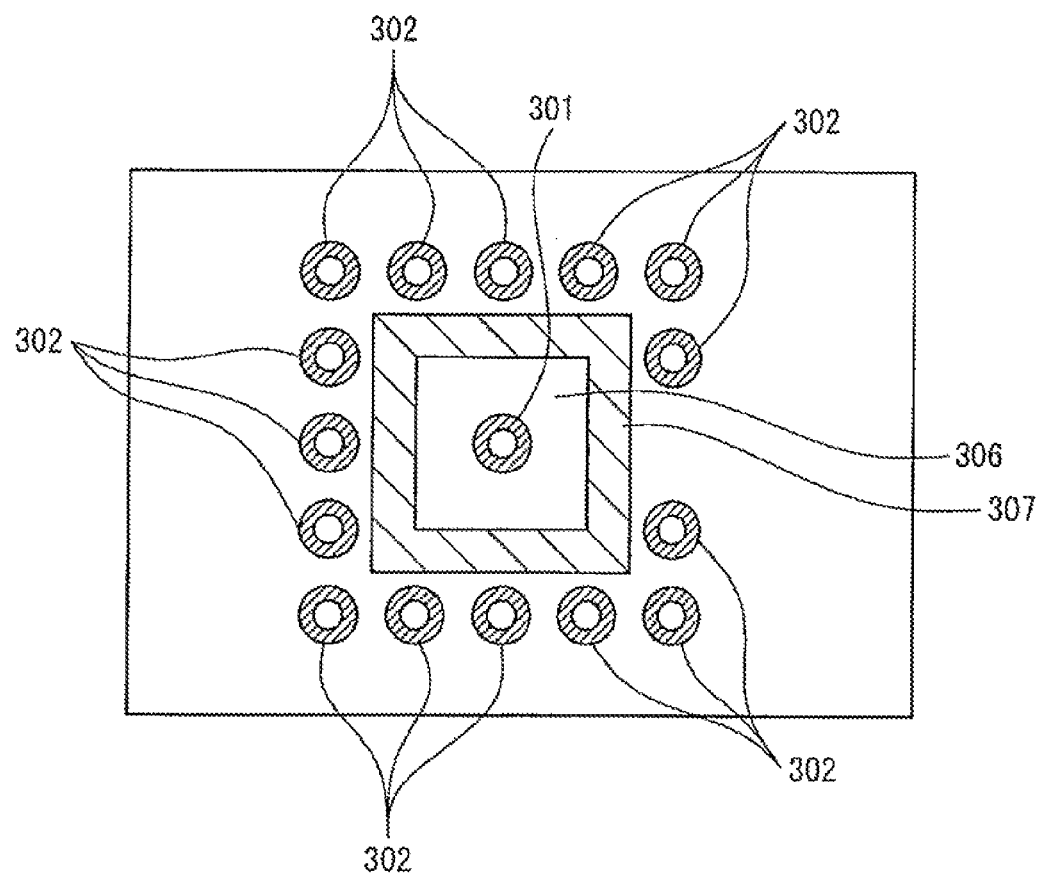
FIG. 3D is a horizontal cross-sectional view of the combined via structure shown in FIG. 3A on 3D-3D section.
Figure 3E:
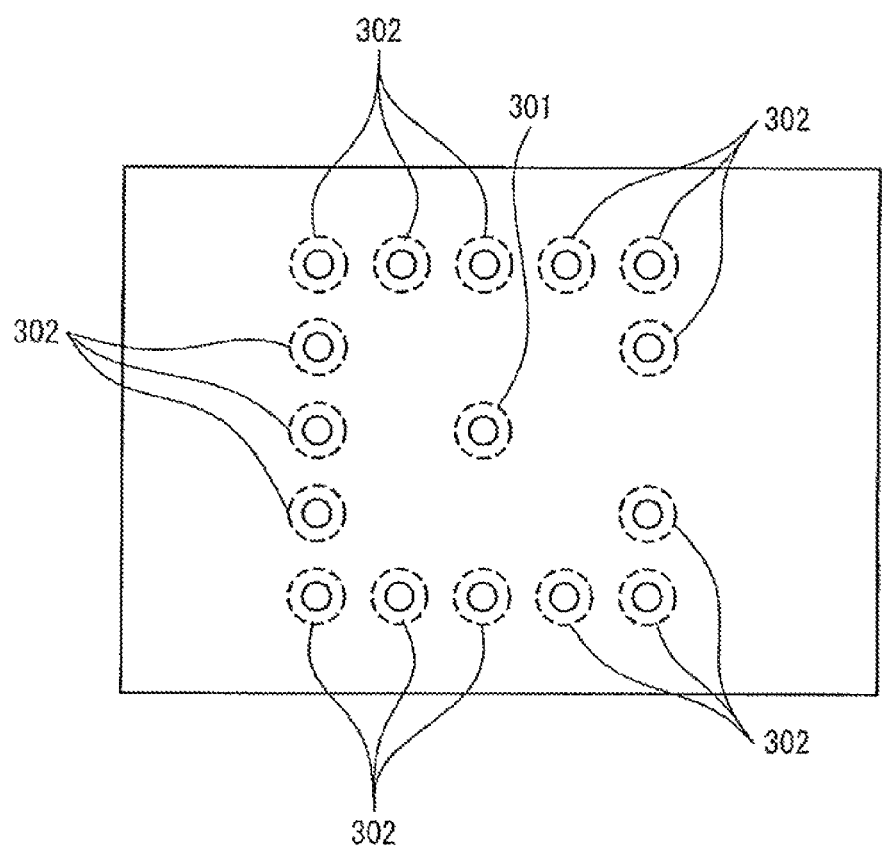
FIG. 3E is a bottom view of the combined via structure shown in FIG. 3A.
Figure 4A:
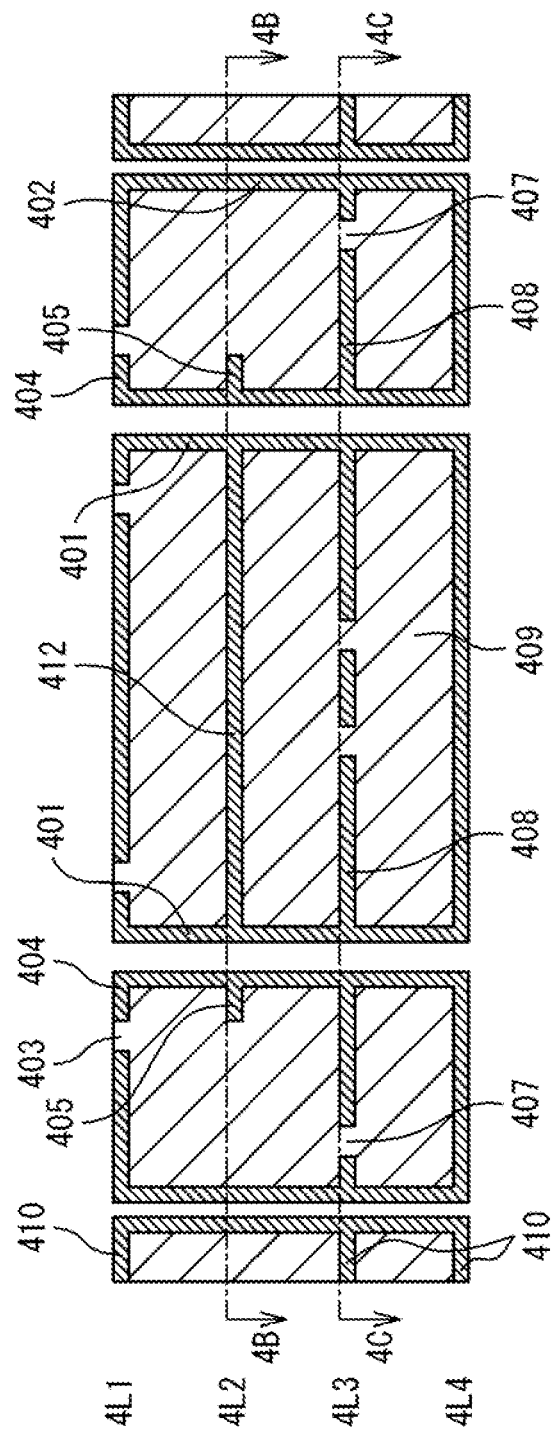
FIG. 4A is a vertical cross-sectional view of a filter in an exemplary embodiment of the present invention.
Figure 4B:
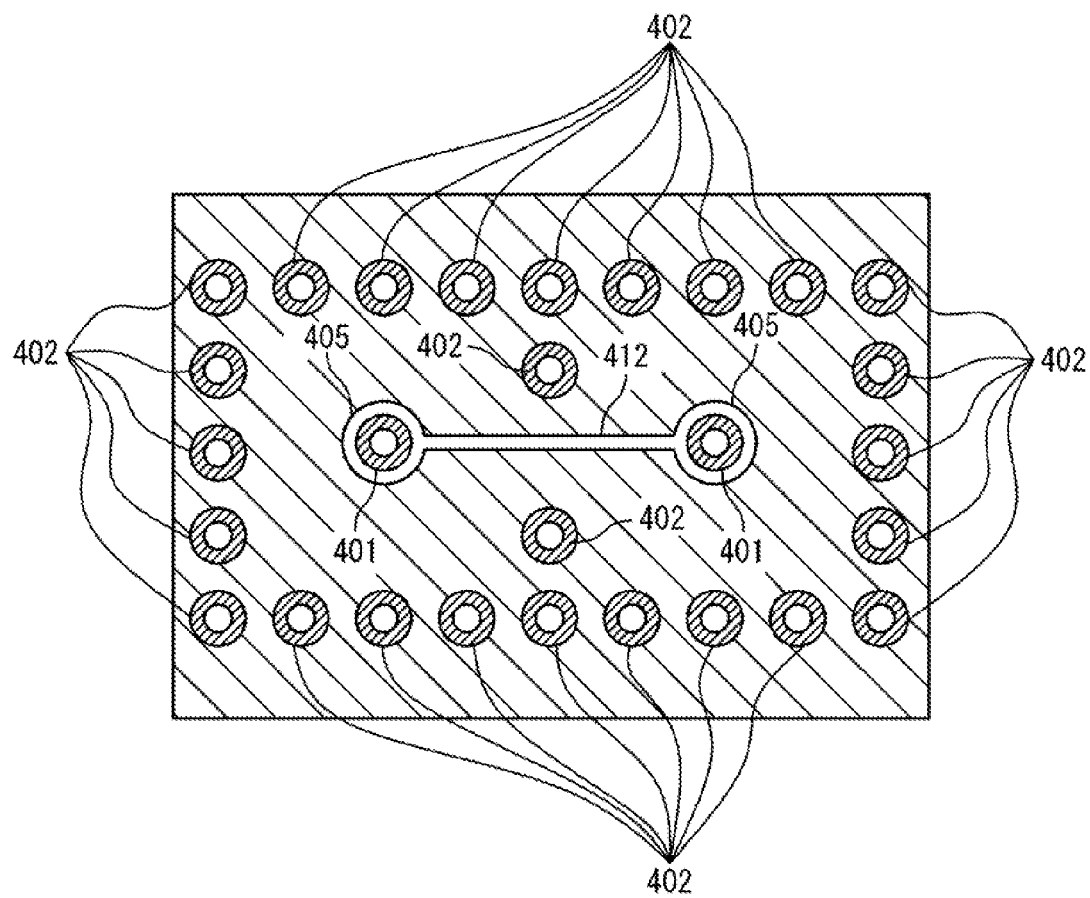
FIG. 4B is a horizontal cross-sectional view of the filter shown in FIG. 4A on 4B-4B section.
Figure 4C:
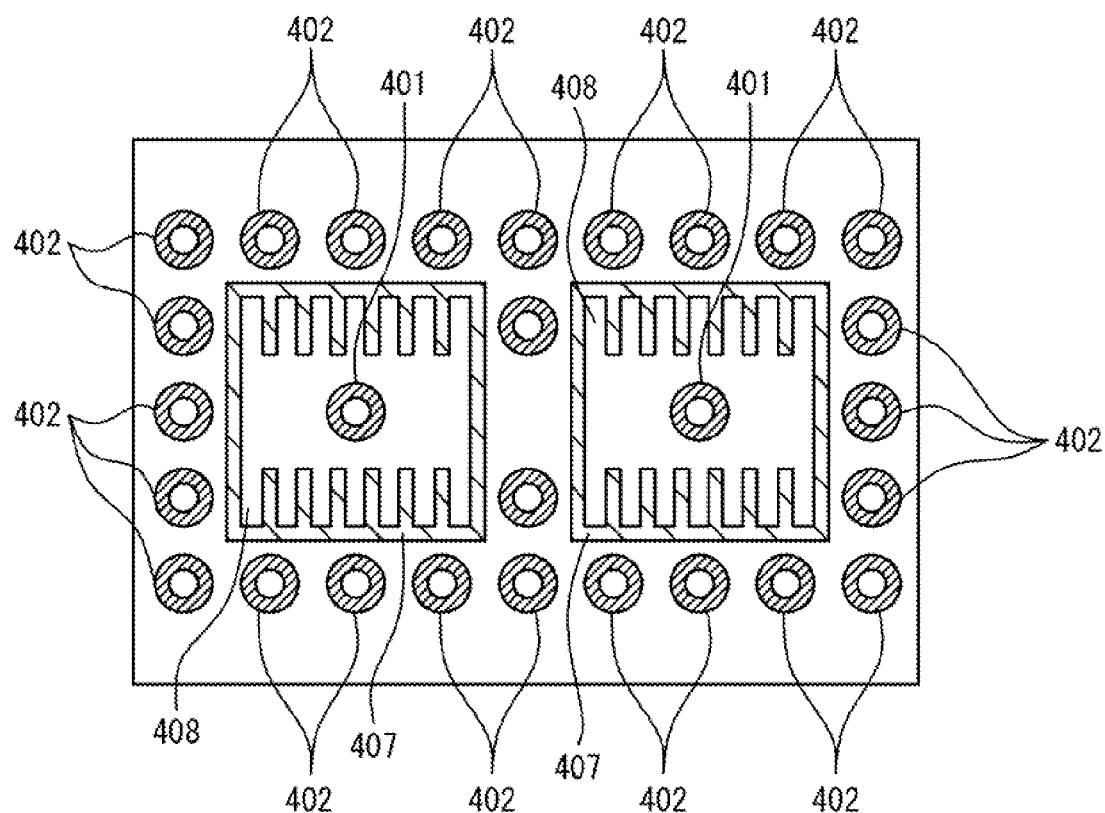
FIG. 4C is a horizontal cross-sectional view of the filter shown in FIG. 4A on 4C-4C section.
Figure 4D:
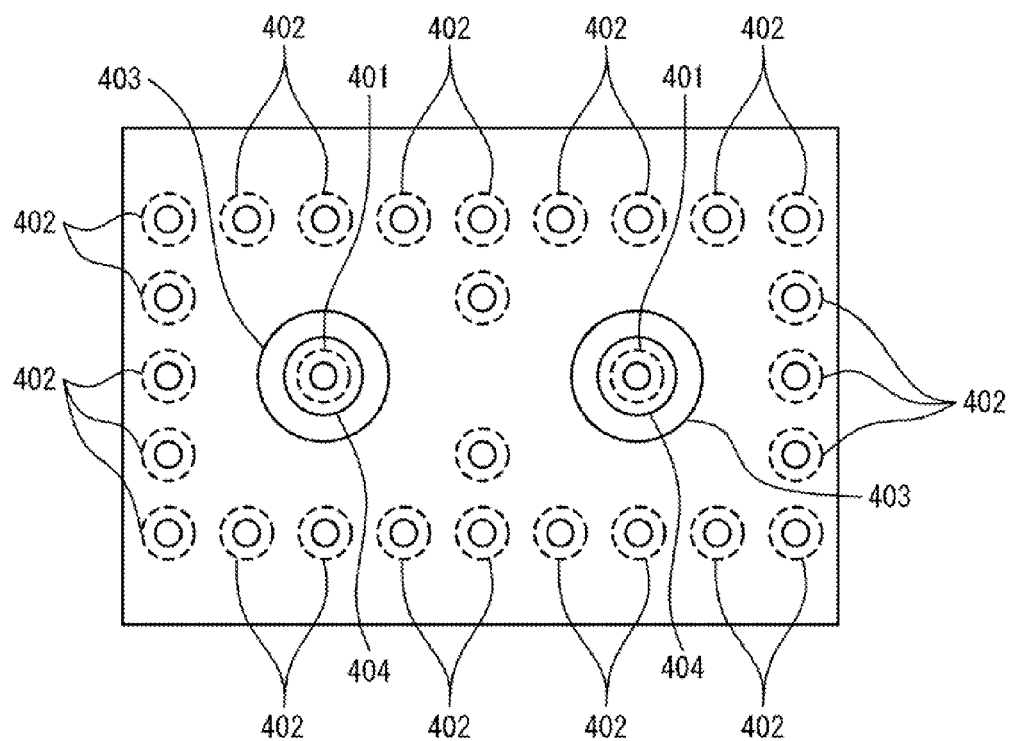
FIG. 4D is a top view of the filter shown in FIG. 4A.
Figure 4E:
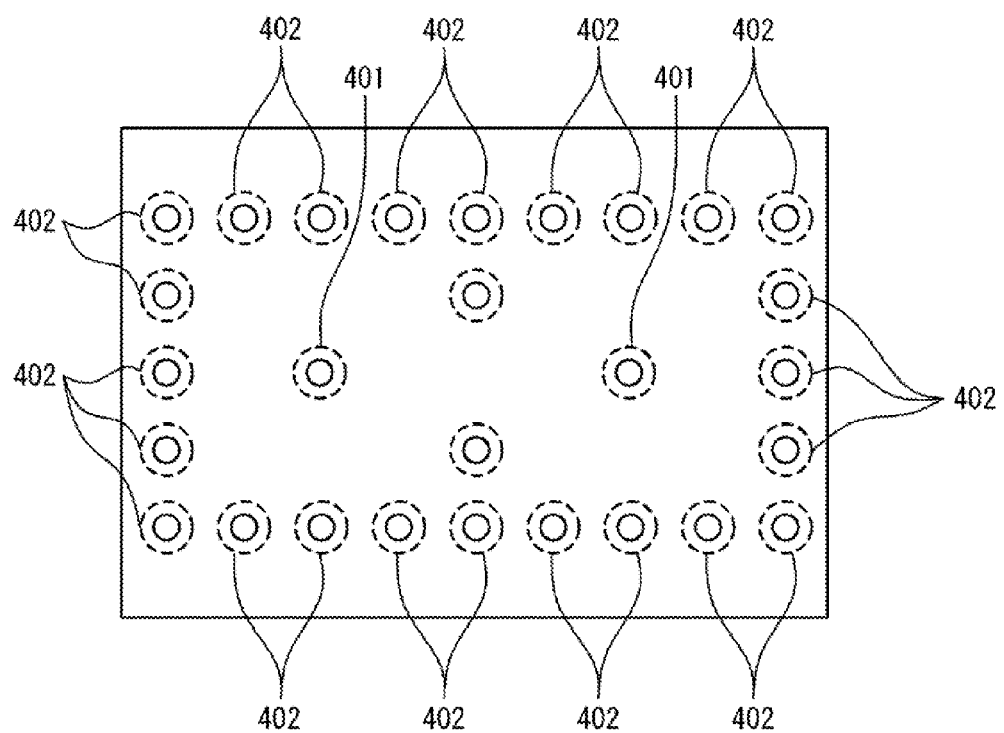
FIG. 4E is a bottom view of the filter shown in FIG. 4A.

Hereinafter, several types of combined via structures and compact filters based on these via structures disposed in multilayer boards according to the present invention will be described in detail with reference to attached drawings. But, it would be well understood that this description should not be viewed as narrowing the appended claims.

In FIGS. 1A to 1E, an exemplary embodiment of a combined via structure in a multilayer board is shown. This multilayer board is provided with a plurality of conductor layers 1L1 to 1L6. Six conductor layers 1L1 to 1L6 are isolated by a dielectric material 109. Conductor layers 1L1, 1L2, 1L4, 1L5 and 1L6 serve as ground layers. Conductor layer 1L3 serves as signal transmitting layer.

Note this six conductor layer board is only an example of multilayer boards and a number of conductor layers, filling material and other board parameters can be different that depends on real applications.

In present embodiment, the combined via structure comprises two working parts. The first working part is arranged from the conductor layer 1L1 to the conductor layer 1L3. The second working part is disposed from the bottom part of the conductor layer 1L3 to the conductor layer 1L6.

The first working part comprises segments of signal via 101 and segments of ground vias 102. Those segments of ground vias 102 are connected to ground planes 110 (conductor layers 1L1 and 1L2). Signal and ground conductors in this part are separated by the clearance region 103. The pad 104 connected to the signal via 101 at top conductor plane (layer 1L1) and connection pad 105 joined to the signal via at layer 1L3 are included to the first working part. Control of the characteristic impedance in this part is carried out by transverse dimensions of the signal via 101, the distance between signal via 101 and ground vias 102 as well as dimensions of the clearance hole 103.

The second working part of the combined via structure comprises segment of the signal via 101 and segments of ground vias 102. Those segments of ground vias 102 are connected to ground planes 110 (conductor layers 1L4, 1L5 and 1L6). Also this part comprises special plates 108 connected to signal via 101. These plates 108 have corrugated edges. The plates 108 are isolated from ground conductors by means of isolating slit 107. The use of such plates gives a possibility to control characteristic impedance and propagation constant in the second working part. The corrugation of the edge of plates 108 is used to gain the characteristic impedance and propagation constant to control as well as to improve pass band and stop band characteristics.

Ground vias around the first and second working parts play an important role, because they suppress leakage from the combined via structure and increase the quality factor (Q-factor) of the second working part when this part is used as the resonant stub.

It should be noted that the combined via structure shown in FIGS. 1A to 1E can be used to provide open-circuited resonance stub, because the signal via pad 113 in the second working part is isolated from bottom conductor layer (layer 1L6) by means of clearance region 111.

In FIGS. 2A to 2E, another embodiment of the combined via structure in a six conductor layer board is shown. This combined via structure comprising two working parts is proposed to provide a short-circuited stub in the multilayer board. The first working part is arranged from the top conductor plane (conductor layer 2L1) to the connection pad 205 (conductor layer 2L3). This part includes the signal via 201, ground vias 202 connected to ground planes 210, signal via pad 204 and connection pad 205. Signal section of the first working part is separated from ground conductors by the clearance region 203.

The second working part of the combined via structure is arranged in the vertical direction from the bottom of connection pad 205 (conductor layer 2L3) to the bottom conductor plane (conductor layer 2L6). This part includes signal via 201 and ground vias 202 connected to ground planes 210. Corrugated plates 208 are connected to signal via 201. In this combined via structure bottom end of the signal via is connected to ground plate (conductor layer 2L6). This connection gives a possibility to provide the resonant short-circuited stub using such combined via structure.

The main distinguishing point of this invention is the use of the corrugation for the edges of the conductive plate 208 which can be provided on all sides of the conductive plates or on their part.

In FIGS. 3A-3E, relating art to the current invention is presented. In this case, the via structure comprises smooth conductive plates 306.

The main application of proposed combined via structures is providing filters disposed in a multilayer board.

In FIGS. 4A-4E, a band-pass filter disposed in a four-conductor-layerboard is shown. The filter comprises two invented combined via structures in which connection pads 405 are joined by the stripline 412. In this filter, the first working part of the combined via structure comprises the signal via 401 and ground vias 402 connected to ground planes 410, signal via pad 404 and connection pad 405. Signal and ground conductors in this part are separated by the clearance region 403. This working part is arranged from top conductor plane (layer 4L1) to the connection pad 405 (conductor layer 4L2).

The second working part forms the resonance short-circuit stub providing a predetermined pass band of the filter and is arranged from the bottom side of the connection pad 405 to the bottom conductor layer 4L4. Control of the position of the pass band is made by means of transverse dimensions of the conductive plate 408 connected to signal via 401 and separated from ground conductor by isolating slit 407. Also, this position is adjusted by the corrugation of edges of conductive plate 408. Moreover, this corrugation can improve pass band parameters such as sharpness of characteristics. It should be noted that the signal via 401 of the second working part is connected to the ground conductor plane 4L4.

The input/output ports (terminals) of the filter are signal pads 404.

To show characteristic properties of proposed method using the corrugation of the plates connected to the signal via and forming the resonant stub structure, the band pass filter having the same structure as in FIGS. 4A-4E was simulated by the Finite-Difference Time-Domain (FDTD) technique which is one of the most widely-used methods.

Figure 5:
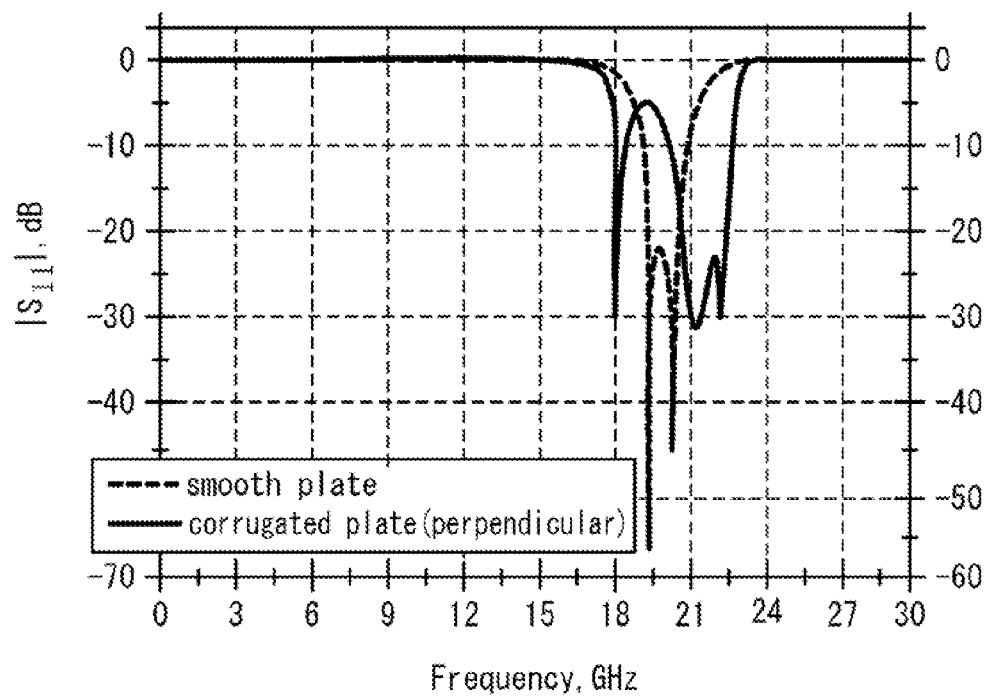
FIG. 5 is a graph showing the effect of the corrugated plates for the band-pass filter shown by means of simulated return losses (for the filter shown in FIGS. 4A-4E)
Figure 6:
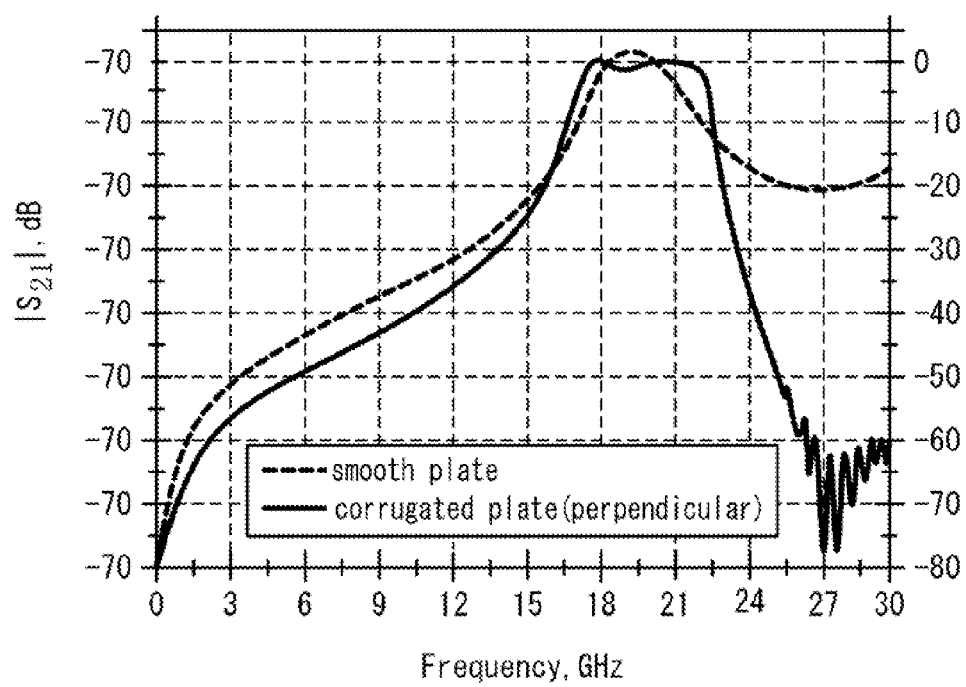
FIG. 6 is a graph showing the effect of the corrugated plates for the band-pass filter shown by means of simulated insertion losses (for the filter shown in FIGS. 4A-4E)
Figure 7B:
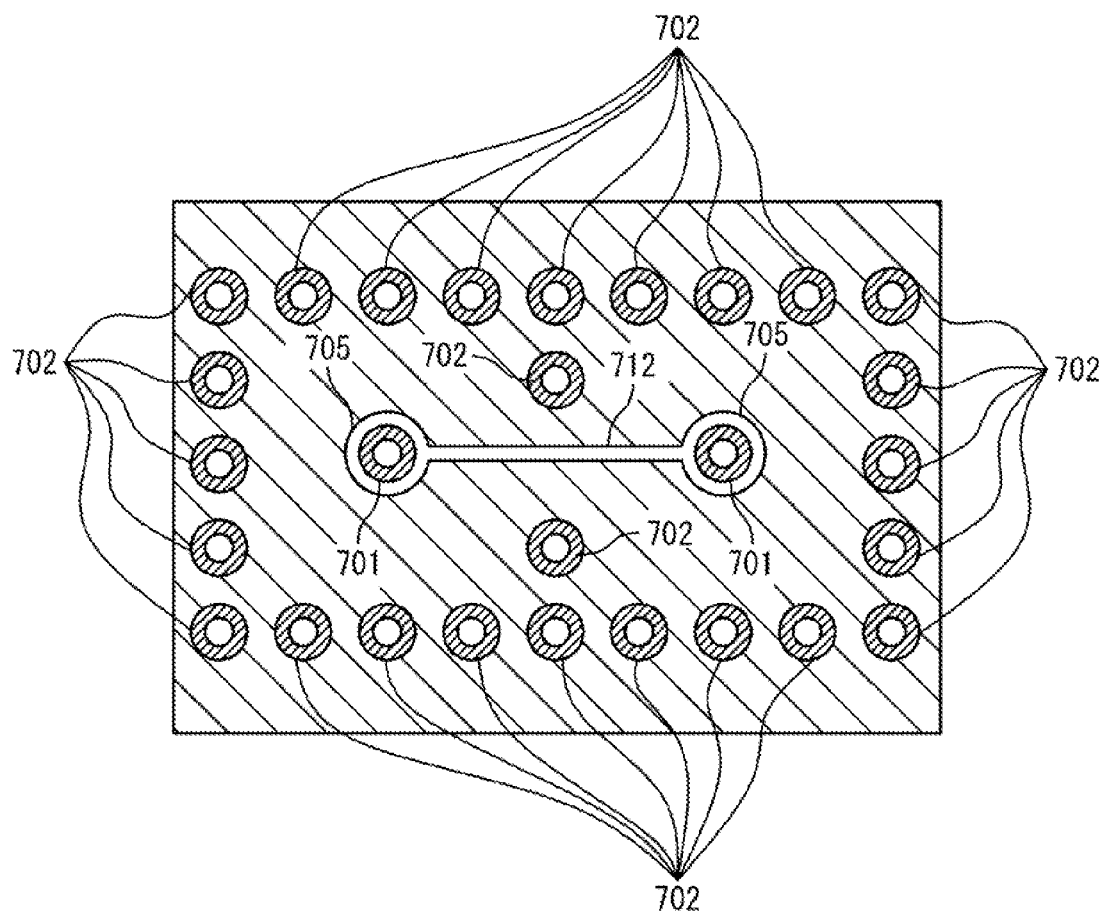
FIG. 7B is a horizontal cross-sectional view of the filter shown in FIG. 7A on 7B-7B section.
Figure 7C:
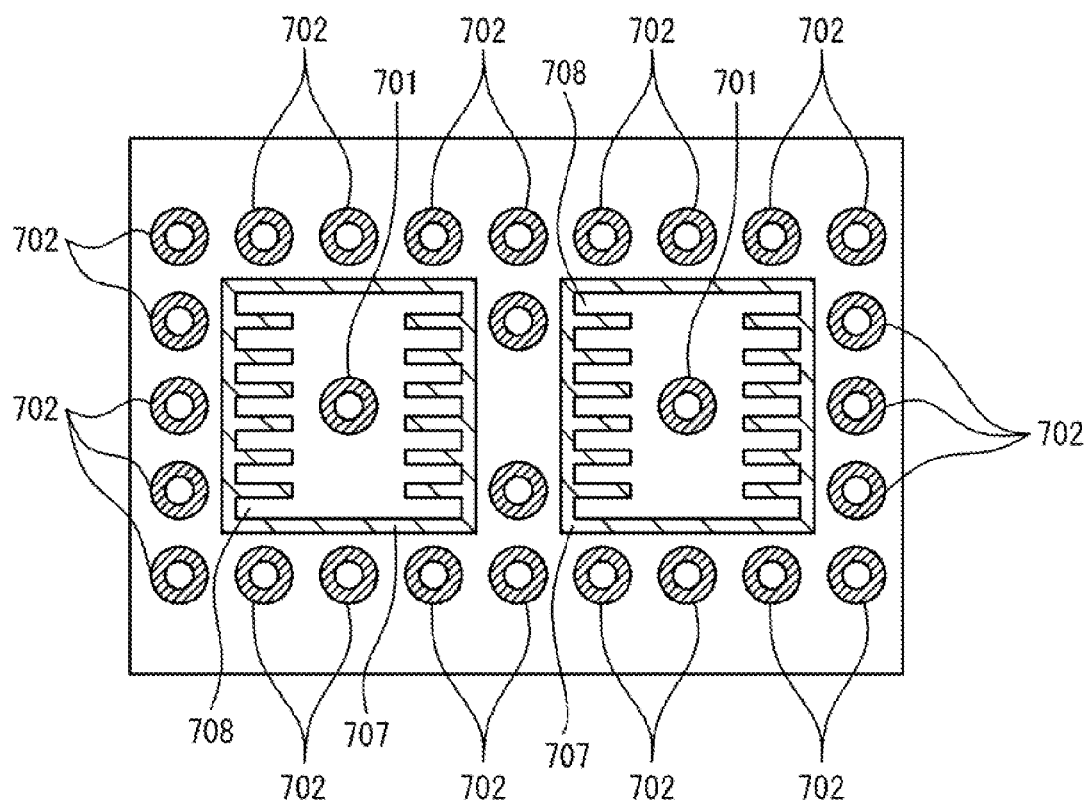
FIG. 7C is a horizontal cross sectional view of the filter shown in FIG. 7A on 7C-7C section.
Figure 7D:
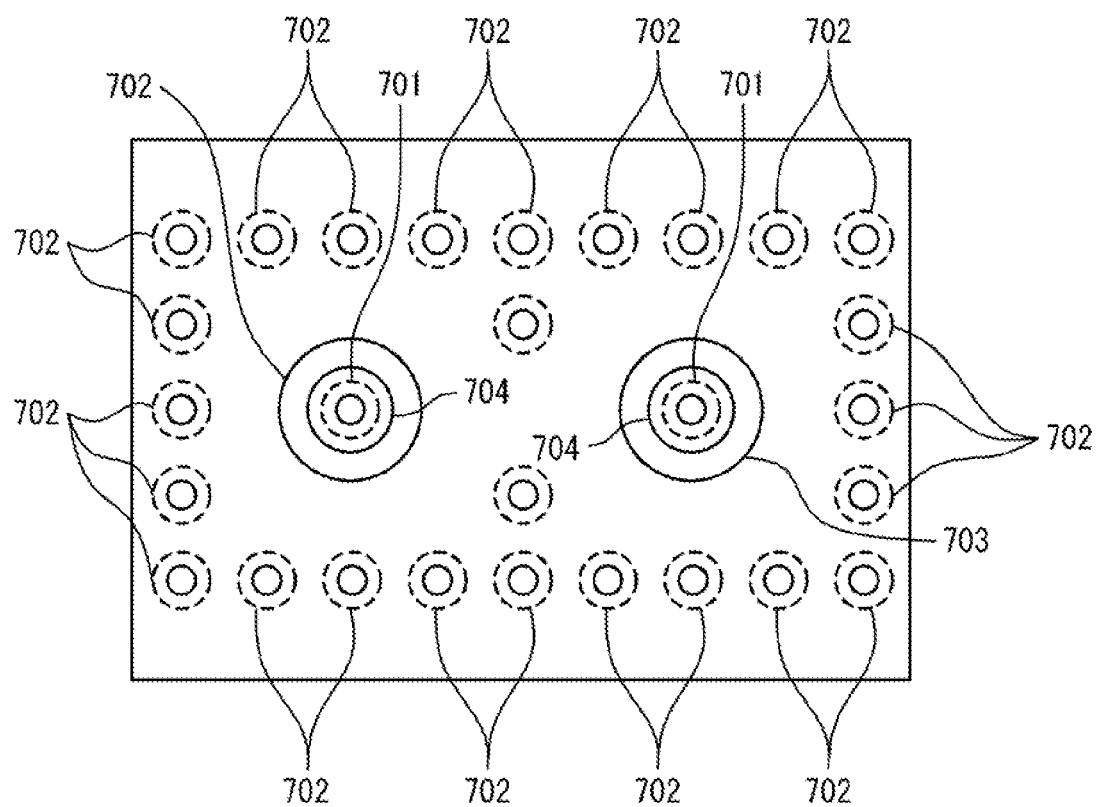
FIG. 7D is a top view of the filter shown in FIG. 7A.
Figure 7E:
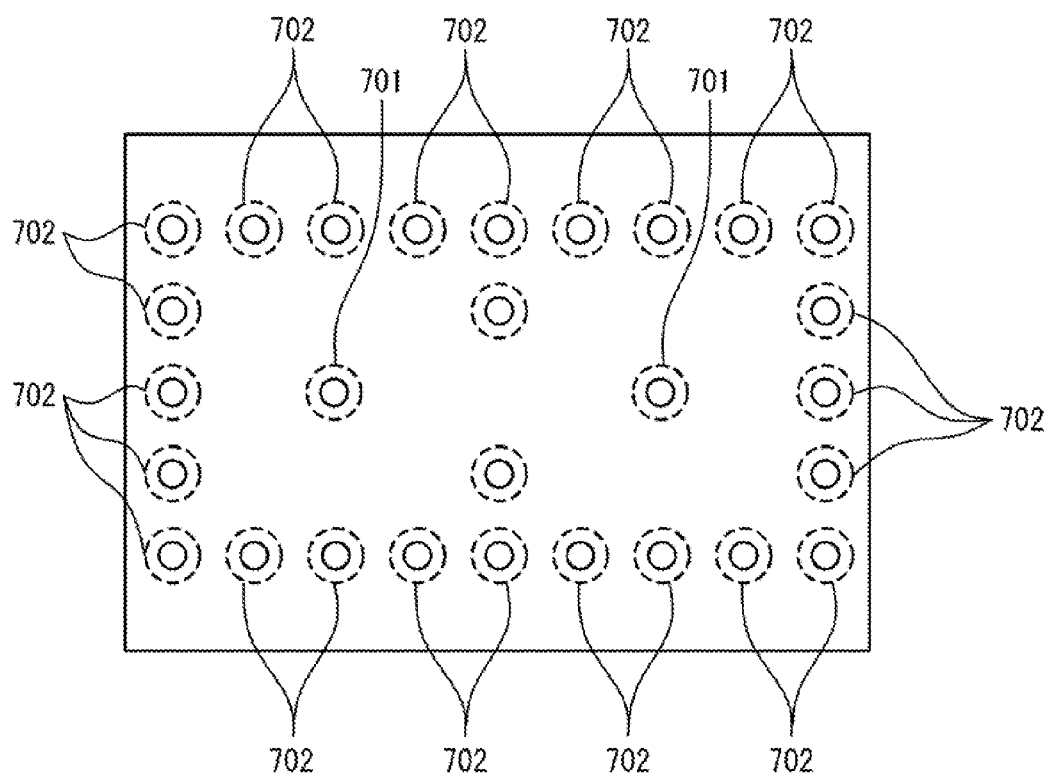
FIG. 7E is a bottom view of the filter shown in FIG. 7A.

In FIGS. 5 and 6, return ($|S_{11}|$-parameter) and insertion ($|S_{21}|$-parameter) losses are respectively presented. In these figures, "corrugated plate (perpendicular)" means the use of the corrugation of the edges like plate 408. Also, for comparison, a case, when corrugated plate is replaced by smooth plate similar to plate 306 in FIGS. 3A-3E, is shown as "smooth plate".

It should be noted that in presented filter the corrugation is provided on two opposite sides of the conductive plate 408 and orientation of the corrugation is in perpendicular to the horizontal direction of the stripline 412 connecting the combined via structures.

Characteristic dimensions of the filter are as following: the thickness of the multilayer board is 1.1 mm; the thickness of each copper conductor layer is 0.035 mm; ground vias of the combined via structure are arranged as the square with the side of 3.0 mm; the length of the second working part in the vertical direction is 0.6 mm; conductive plates connected to the signal via has the square form with the side of 2.7 mm; the isolating slits separating these plates from the ground conductors have the width of 0.05 mm; the corrugation has the rectangular form with the depth of 0.8 mm and width of 0.1 mm; distance between signal vias is 3.0 mm.

The filter of relating art presented in the FIGS. 5 and 6 by the data marked as "smooth plate" has the same dimensions as the filter comprising invented combined via structures but only the smooth plate of the square form with side of 2.7 mm has been used instead of the corrugated plate.

As can be traced from simulation results, the main effects of the corrugated conductive plate shown in FIGS. 4A-4E are as following. The corrugation can widen the pass band and also can considerably improve its sharpness.

It should be noted that orientation of the corrugation in the conductive plate with respect to a planar transmission line is another important parameter to control frequency response of the filter designed by means of invented combined via structures.

Consider another exemplary embodiment shown in FIGS. 7A to 7E, in which the band-pass filter comprising invented combined via structures with an alternative corrugation in the conductive plate has been presented. The first working part of these combined via structures is arranged from the signal via pad 704 (conductor layer 7L1) to the connection pad 705 (conductor layer 7L2). This working part comprises the signal via segment 701 to which signal via pad 704 and connection pad 705 are connected and ground vias 702 connected to ground planes 710. Signal and ground conductors in this part are isolated by the clearance region 703.

The second working part of the combined via structures is arranged from the bottom side of the connection pad 705 to the bottom conductor plane (layer 7L4). This working part comprises segment of signal via 701 jointed to the connection pad 705 and segments of ground vias 702 jointed to ground planes 710. Also in this working part, the corrugated conductive plate 708 is connected to the signal via segment 701 and separated from ground conductors by an isolating slit 707.

In this filter, two combined via structures are connected to the stripline 712 by means of the connection pad 705 and resonance short-circuited stubs are provided by connection of the signal vias 701 to the bottom ground plane 710 (conductor layer 7L4).

The distinguishing point of this filter is combined via structures comprising the conductive plate corrugated in the parallel direction to the orientation of the stripline connecting these combined via structures.

Figure 8:
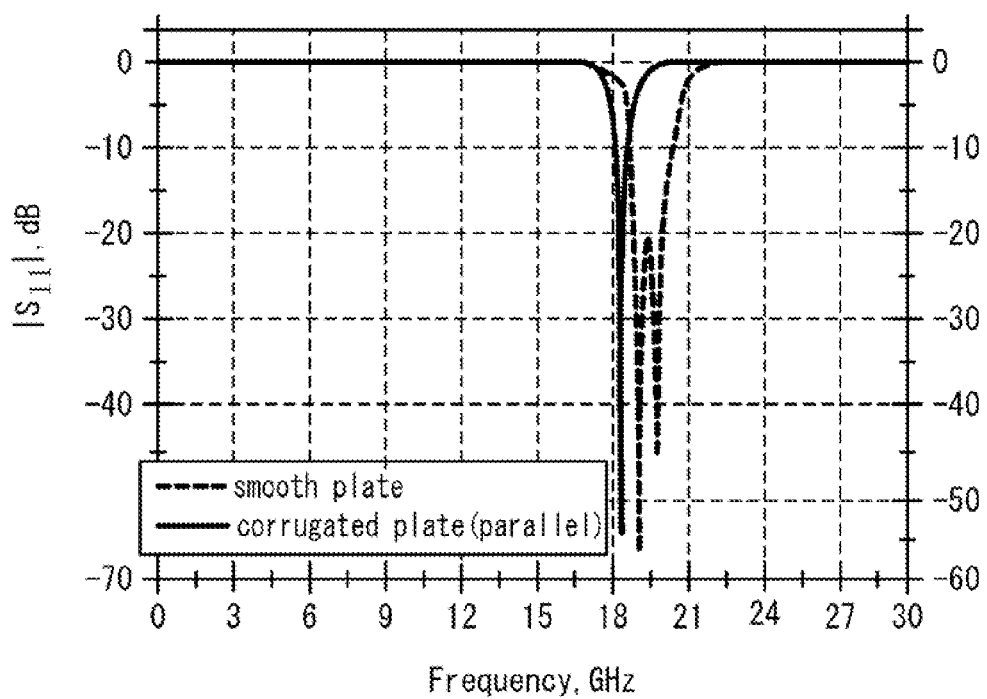
FIG. 8 is a graph showing the effect of the corrugated plates for the band-pass filter shown by means of simulated return losses (for the filter shown in FIGS. 7A-7E)
Figure 9:
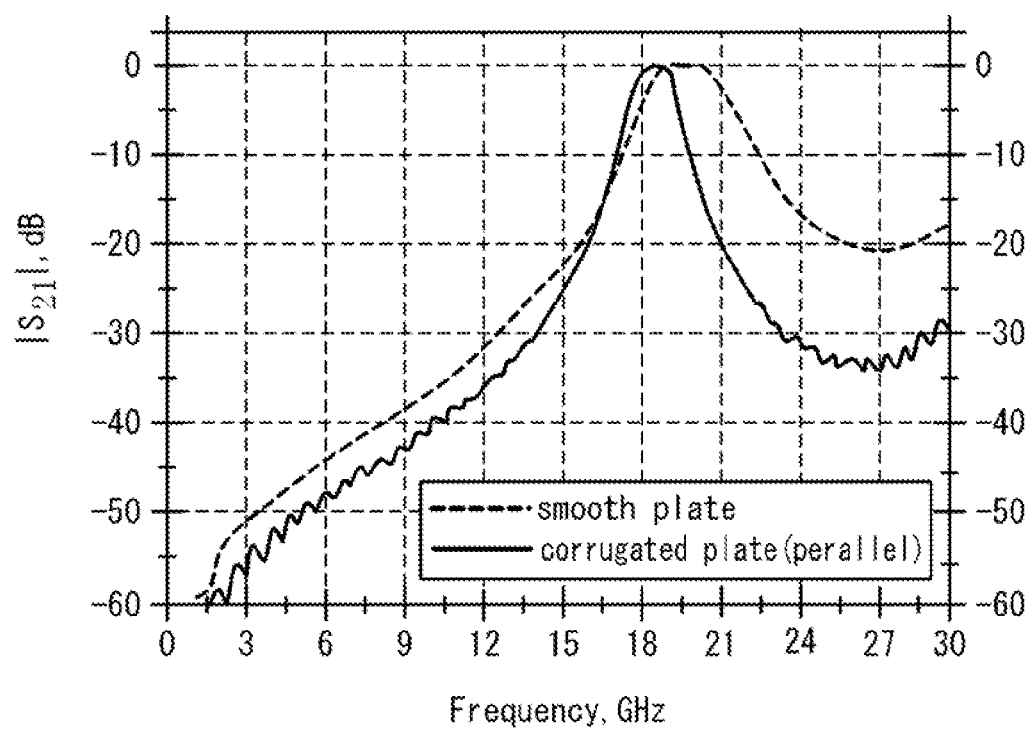
FIG. 9 is a graph showing the effect of the corrugated plates for the band-pass filter shown by means of simulated insertion losses (for the filter shown in FIGS. 7A-7E)
Figure 10B:
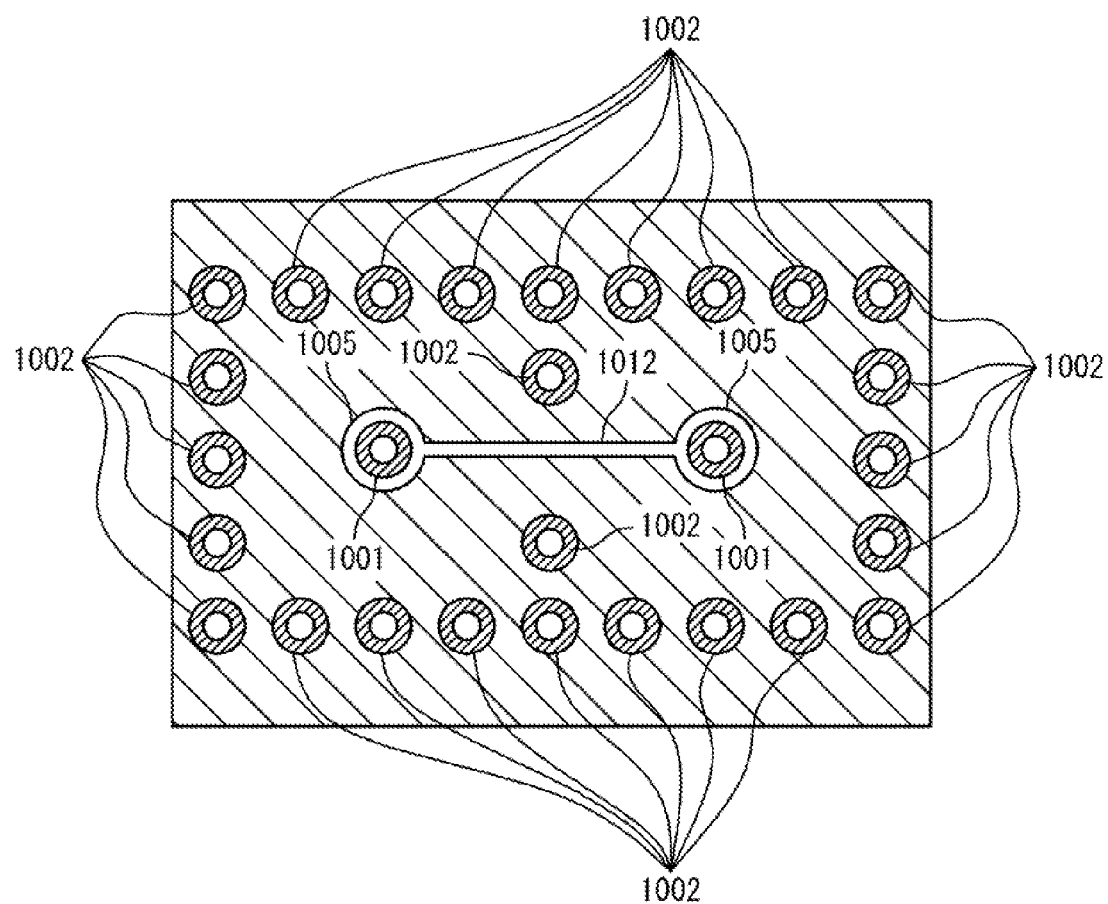
FIG. 10B is a horizontal cross-sectional view of the filter shown in FIG. 10A on 10B-10B section.
Figure 10C:
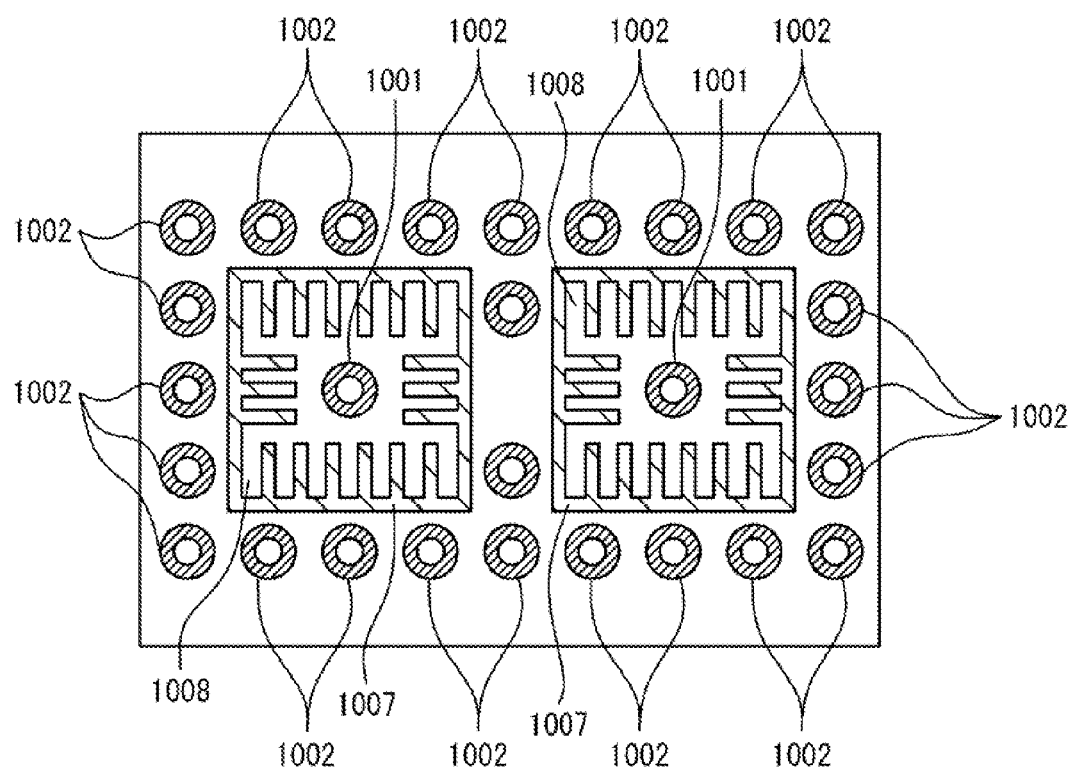
FIG. 10C is a horizontal cross-sectional view of the filter shown in FIG. 10A on 10C-10C section.
Figure 10D:
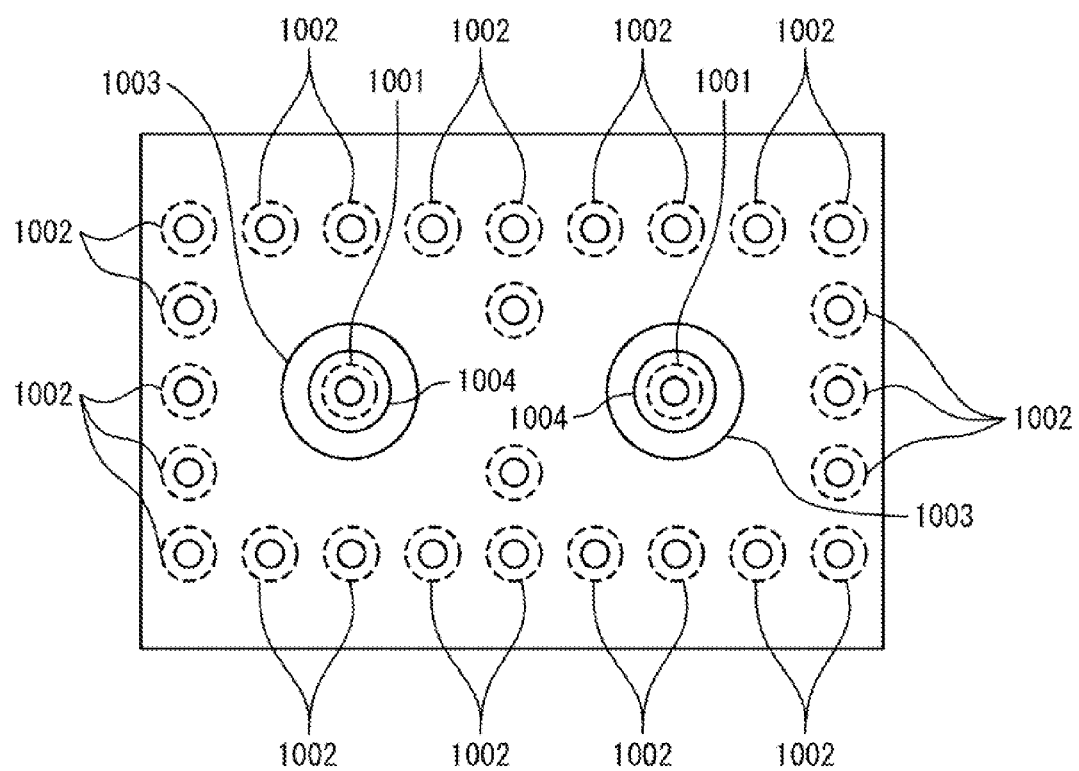
FIG. 10D is a top view of the filter shown in FIG. 10A.
Figure 10E:
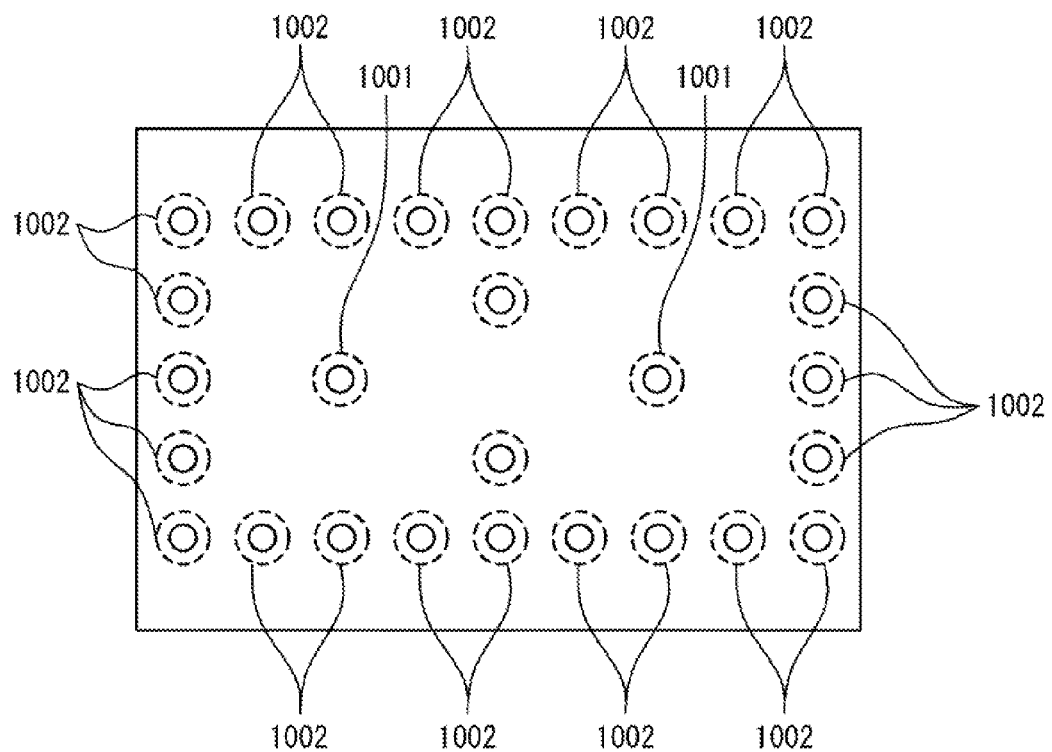
FIG. 10E is a bottom view of the filter shown in FIG. 10A.

In FIGS. 8 and 9, return and insertion losses are respectively presented for the filter shown in FIGS. 7A to 7E. In these figures, "corrugated plate (parallel)" is given for the corrugation of the edges like plate 708. Also, a case, when corrugated plate is replaced by smooth plate similar to plate 306 in FIGS. 3A-3E, is shown as "smooth plate". The dimensions of the filter comprising the invented combined via structures and the filter of relating art are the same as for FIGS. 5 and 6.

From simulation results, the main effects of the parallel-to-stripline corrugation of the conductive plate can be traced as following. Such corrugation can shift the pass band to lower frequencies that can provide more compact transverse dimensions of the filter if it is compared with the filter of relating art. Another important property of the application of such corrugation is also a considerable improvement of the sharpness of the pass band.

Another exemplary embodiment of the filter is shown in FIGS. 10A to 10E. This filter comprises two invented combined via structures. The first working part of these combined via structures is arranged in the vertical direction from the signal via pad 1004 (conductor layer 10L1) to the connection pad 1005 (conductor layer 10L2). This working part comprises the segment of signal via 1001 to which the signal via pad 1004 and connection pad 1005 are attached and ground vias 1002 connected to ground planes 1010. Signal and ground conductors in the first part are separated by the clearance region 1003.

The second working part of these combined via structures is arranged in the vertical direction from the bottom side of the connection pad 1005 to the bottom conductor plane (layer 10L4). This working part comprises segments of signal via 1001 connected to the connection pad 1005 and ground vias 1002 connected to ground planes 1010. Also in this working part, the corrugated conductive plate 1008 is connected to the signal via 1001 and is separated from ground conductors by an isolating slit 1007.

Short-circuited resonant stub in presented filter is provided by the connection of the signal via 1001 to the bottom ground plane 1010 (conductor layer 10L4).

A distinctive feature of this filter is the combined via structures comprising the conductive plate 1008 corrugated in both parallel and perpendicular directions with respect to the orientation of the stripline 1012 connecting these combined via structures.

Figure 11:
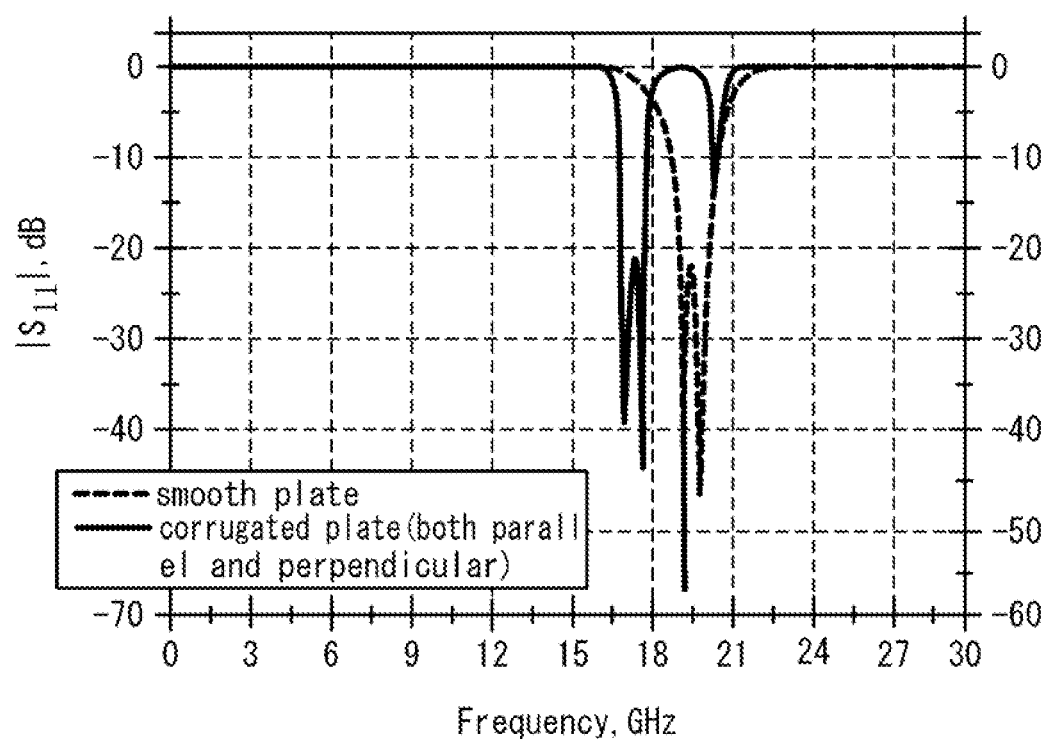
FIG. 11 is a graph showing the effect of the corrugated plates for the band-pass filter shown by means of simulated return losses (for the filter shown in FIGS. 10A-10E)
Figure 12:
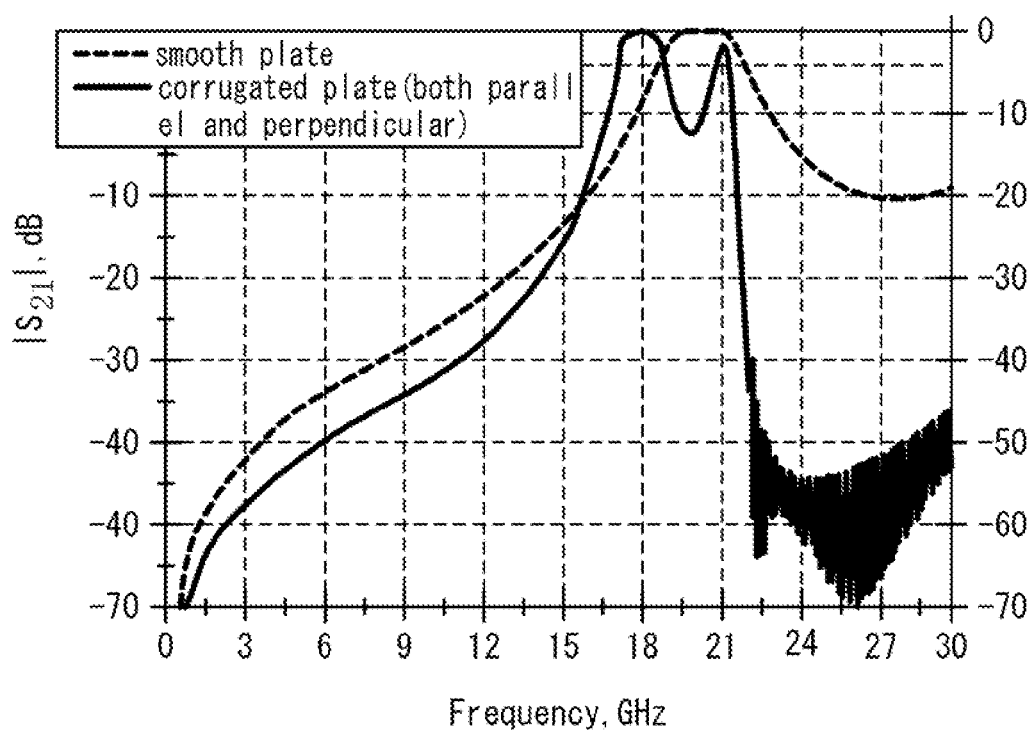
FIG. 12 is a graph showing the effect of the corrugated plates for the band-pass filter shown by means of simulated insertion losses (for the filter shown in FIGS. 10A-10E)

In FIGS. 11 and 12, return and insertion losses are respectively presented for the filter shown in FIGS. 10A to 10E. In these figures, "corrugated plate (both parallel and perpendicular)" represents the corrugation of the plate edges as shown in FIGS. 10A-10E. Also, a case, when corrugated plate is replaced by smooth plate similar to plate 306 in FIGS. 3A-3E, is shown as "smooth plate". The dimensions of the filter comprising the invented combined via structures and the filter of relating art are the same as for FIGS. 5 and 6.

As one can see, providing both parallel and perpendicular corrugations of the conductive plate with respect to the orientation of a planar transmission line connecting the combined via structures can lead to a dual-band band-pass filter.

Figure 13:
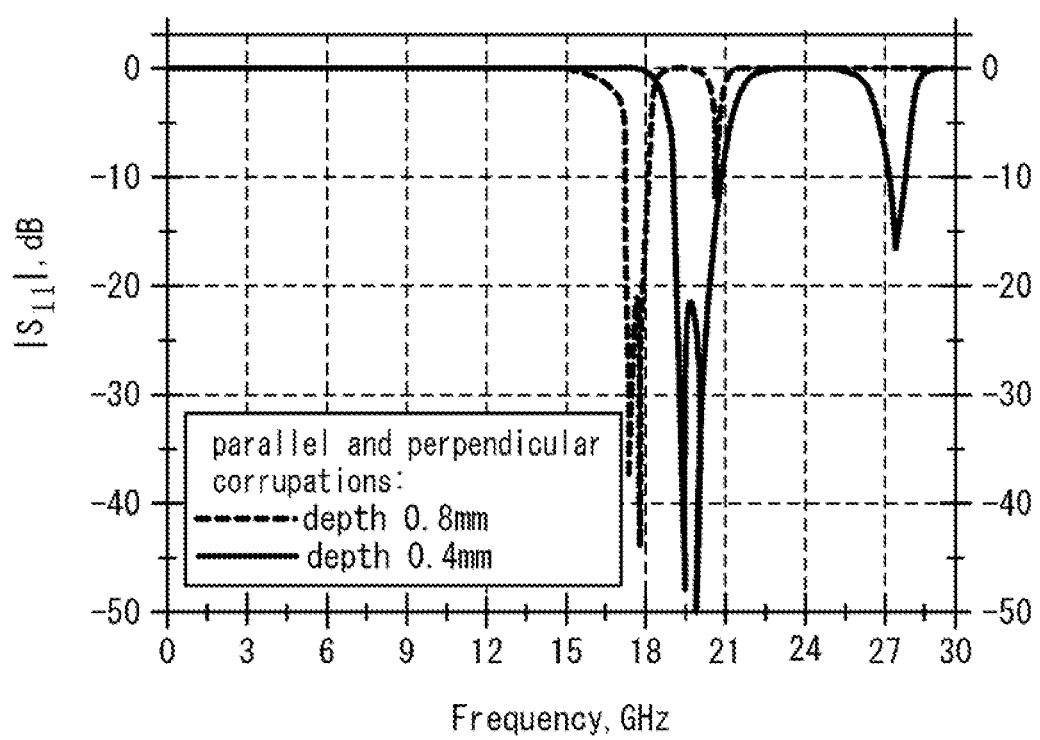
FIG. 13 is a graph showing the effect of the corrugation depth in corrugated plates of the band-pass filter shown by means of simulated return losses (for the filter shown in FIGS. 10A-10E)
Figure 14:
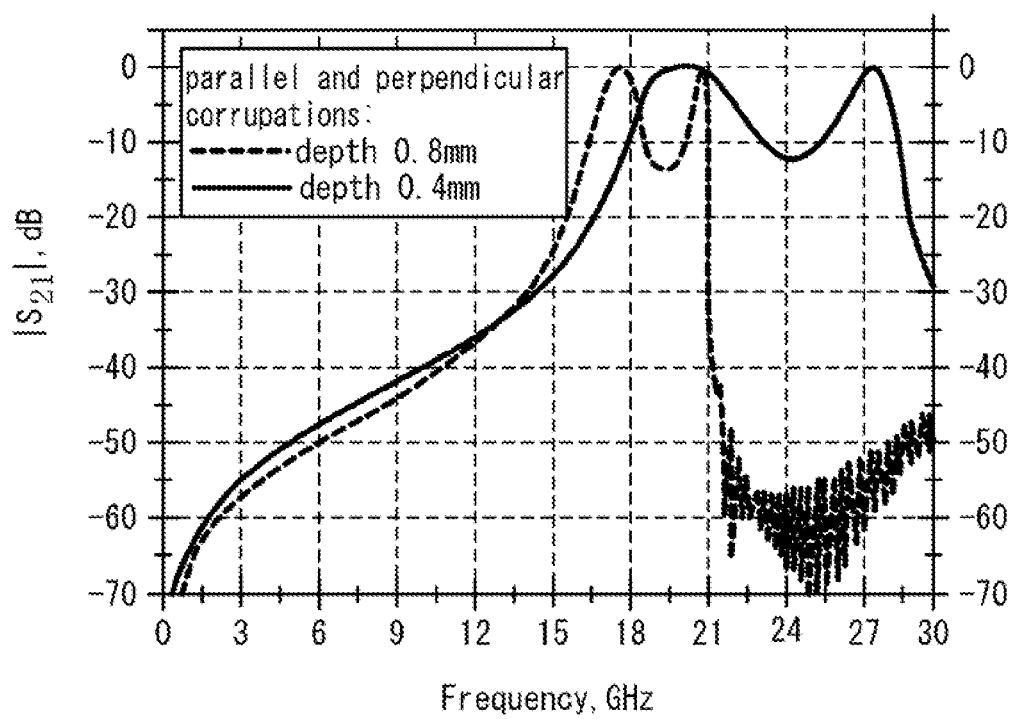
FIG. 14 is a graph showing the effect of the corrugation depth in corrugated plates of the band-pass filter shown by means of simulated insertion losses (for the filter shown in FIGS. 10A-10E)

It should be noted the depth of the conductive plate corrugation is an effective parameter to control the position of the pass band in frequency domain. In FIGS. 13 and 14, return and insertion losses are respectively shown for the dual-band band-pass filter similar to that shown in FIGS. 10A-10E. In these figures, two depths of the corrugation as 0.8 mm and 0.4 mm are used. As follows from presented numerical data both the position of the pass-bands and interval between the pass-bands can be adjusted by the corrugation depth.

Thus, these main advantages of the invented method and structures using the specific corrugation of the conductive plate forming the resonant stub for filtering component can lead to compact and high-performance filters for computing and communication systems.

It should be noted that a filter based on an invented combined via structure can be realized in multilayer boards having different number of conductor planes. Also for the connection of the invented combined via structures, different types of planar transmission lines can be used. Moreover, different shapes of ground vias arrangement around the signal via can be applied in the invented combined via structures to provide a pass band or stop band of the filter.

In FIGS. 15A to 15D another exemplary embodiment of the filter is provided in a three-conductor-layer board. The combined via structures comprises two working parts. The first working part is limited by the signal via pad 1504 in the vertical direction. Also, this working part comprises ground vias 1502 connected to the ground plane disposed at the conductor layer 15L1. It should be noted signal via pad 1504 plays both roles as the connection pad and providing a terminal of the filter.

The second working part of the combined via structure is arranged from the bottom part of the signal via pad 1504 to the bottom conductor layer 15L3. This working part comprises a signal via 1501, ground vias 1502 connected to ground planes 1510, and a corrugated plate 1508 connected to the signal via 1501. The corrugated plate 1508 is separated from ground conductors by an isolating slit 1507.

Connection of the combined via structures in this filter is provided to a micro strip line 1512 by means of signal via pads 1504.

It should be noted that, in this combined via structure, arrangement of ground vias around the signal via has a rectangular shape.

As a way to provide integration of the filter in a system, a coplanar micro strip line 1517 is applied here as an example.

It should be highlighted that the form of the corrugation applied in an invented combined via structure can be different.

In FIGS. 16A to 16F, another exemplary embodiment of the filter is presented. This filter comprises three invented combined via structures disposed in a six-conductor-layer board.

The combined via structure comprises two working parts. The first working part is arranged from the signal via pad 1604 (conductor layer 16L1) to the connection pad 1605 (conductor layer 16L3). This working part includes the signal via segment 1601, segments of ground vias 1602 connected to ground planes 1610, signal via pad 1604 and connect ion pad 1605. Signal section is separated from ground conductors by the clearance region 1603.

The second working part of the combined via structure is arranged in the vertical direction from the bottom of connection pad 1605 to the bottom conductor layer 16L6. This part includes signal via 1601 jointed to the connection pad 1605, ground vias 1602 jointed to ground planes 1610 and special conductive plates 1606 and 1608 connected to the signal via 1601 and signal via pad 1613 separated from ground conductors by the clearance region 1611. It should be noted that in presented exemplary embodiment these plates are as following. The plate 1606 has smooth edges. The plate 1608 has corrugated edges. These plates are separated from ground conductors by isolating slits 1607. The shape of the plate corrugation in this combined via structure is approximately trapezoidal.

The invented combined via structures in this filter are connected to the stripline 1612 having the same length by means of the connection pad 1605.

The signal via pads of the first working part of the combined via structures, which have one connection to the stripline, serve as terminals of this filter. In presented embodiment these are left and right combined via structures shown in FIGS. 16A to 16F.

It should be emphasized that different number of combined via structures connected by a planar transmission line segment can be used to achieve a required pass-band or stop-band characteristics of a filter. Moreover it means that a periodic construction in which an invented combined via structure can be used as an elementary cell can be provided.

It should be well understandable that filters based on invented combined via structures can be incorporated in a system by means of a method. In FIGS. 15A-15D as such method of integration a planar transmission line (in presented example, a coplanar micro strip line) has been used.

Also different types of surface-mount technologies can be used for integration purposes.

Another exemplary embodiment of a filter based on an invented combined via structure is presented in FIGS. 17A to 17F. Also a representative example of integration of the filter to a system is shown in these figures.

Combined via structure shown in FIGS. 17A-17F is provided in a six-conductor-layer board and comprises two working parts. The first working part is arranged in the vertical direction from the specific signal via pad 1704 to the connection pad 1705. This working part includes the signal via segment 1701, ground vias 1702 connected to ground planes 1710, the specific signal via pad 1704 and connection pad 1705. Signal section is separated from ground conductors by clearance region 1703.

The second working part of the combined via structure is arranged in the vertical direction from the bottom of connection pad 1705 (conductor layer 17L3 to the bottom conductor plane (conductor layer 17L6). This part includes segment of signal via 1701 jointed to the connection pad 1705, segments of ground vias 1702 jointed to ground planes 1710, and corrugated conductive plate 1708 connected to the signal via segment 1701 and separated from ground conductors by the isolating slit 1707. Also in this working part, the signal via 1701 is separated from ground conductors by a clearance region 1714. It should be noted that dimensions and form of this type of clearance regions in the second working part can be used to control frequency characteristics of the filter, particularly, the pass band.

The combined via structures of this filter are connected to the stripline 1712 by means of connection pads 1705.

Also it should be emphasized that, in presented example, the filter is integrated to other circuits 1716 by means of a solder ball 1715 connected to the specific signal via pad 1704.

Figure 15B:
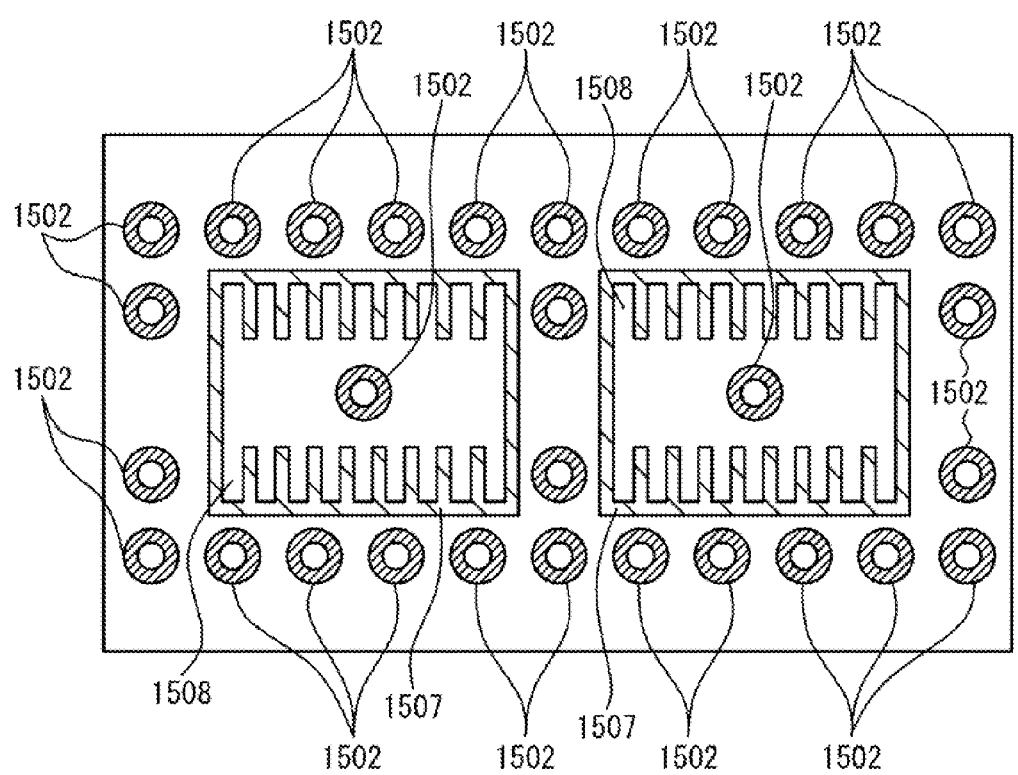
FIG. 15B is a horizontal cross-sectional view of the filter shown in FIG. 15A on 15B-15B section.
Figure 15C:
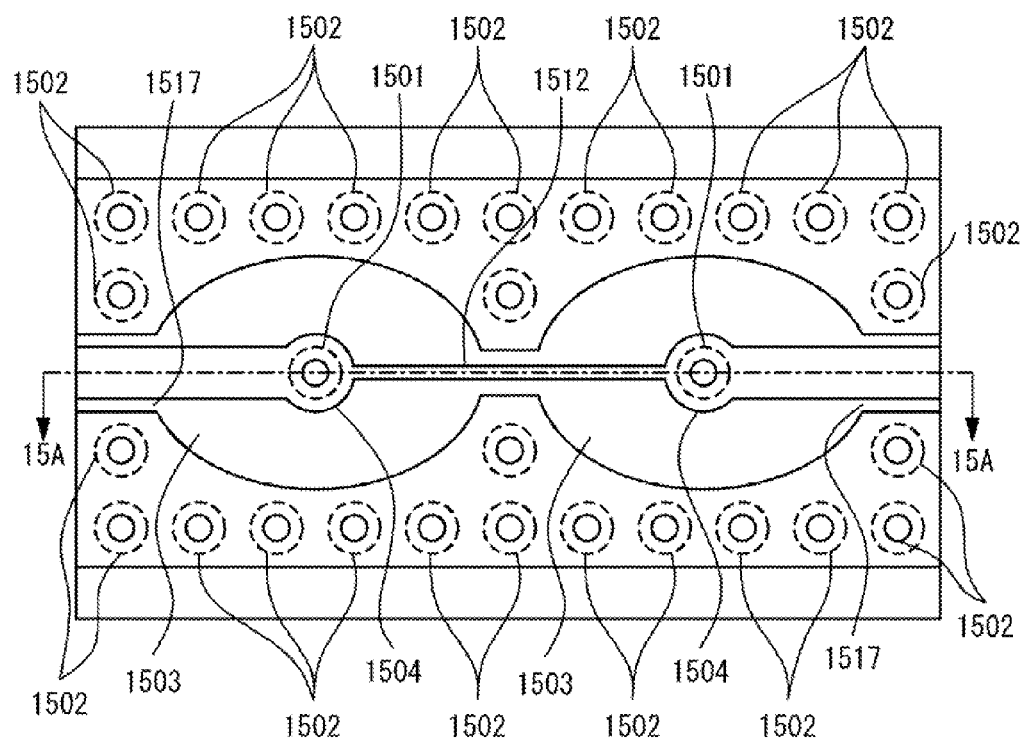
FIG. 15C is a top view of the filter shown in FIG. 15A.
Figure 15D:
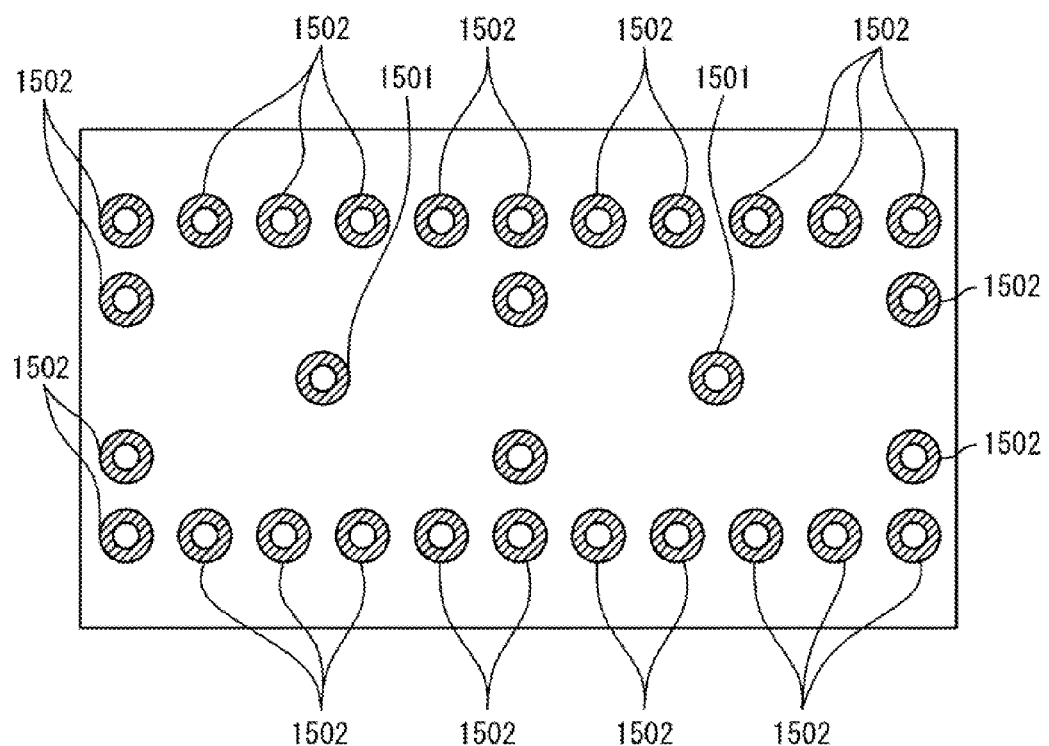
FIG. 15D is a bottom view of the filter shown in FIG. 15A.
Figure 16B:
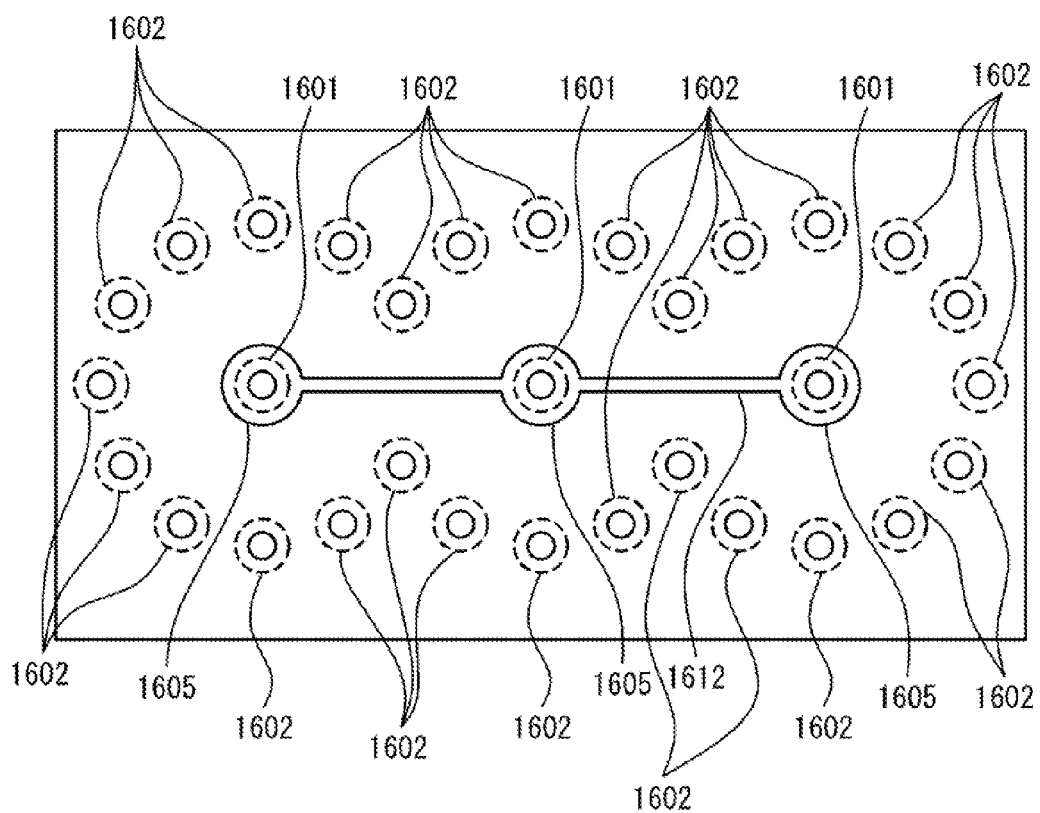
FIG. 16B is a horizontal cross-sectional view of the filter shown in FIG. 16A on 16B-16B section.
Figure 16C:
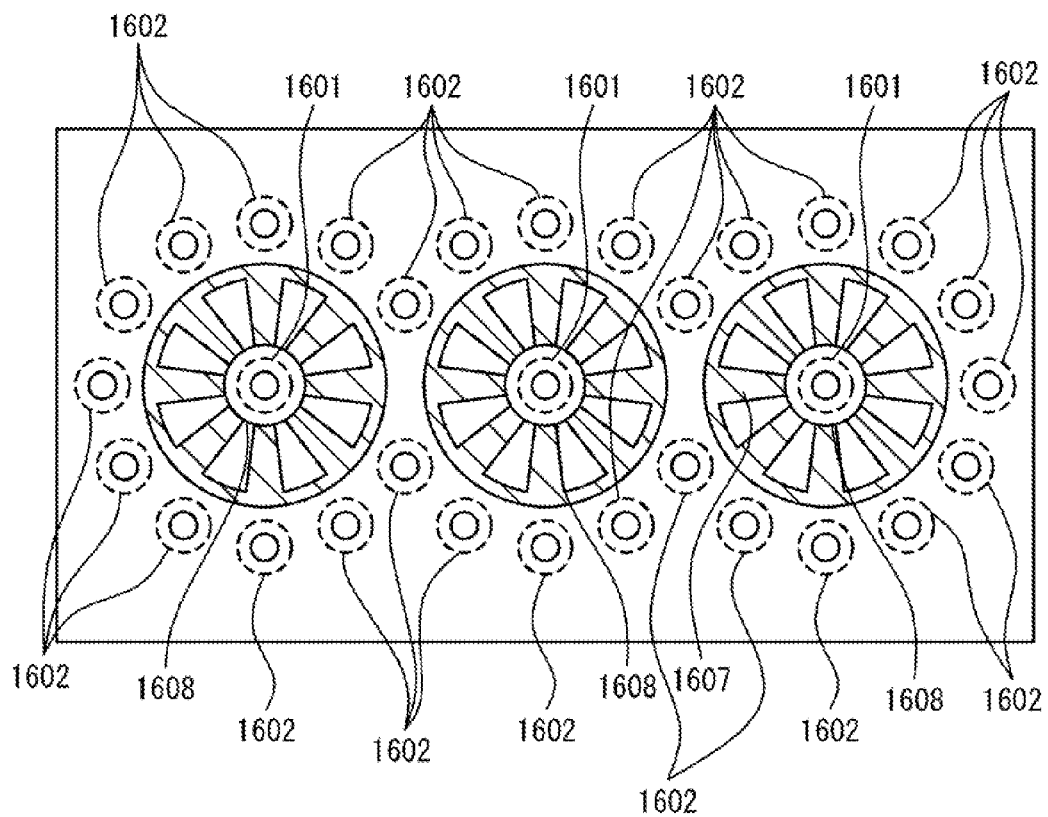
FIG. 16C is a horizontal cross-sectional view of the filter shown in FIG. 16A on 16C-16C section.
Figure 16D:
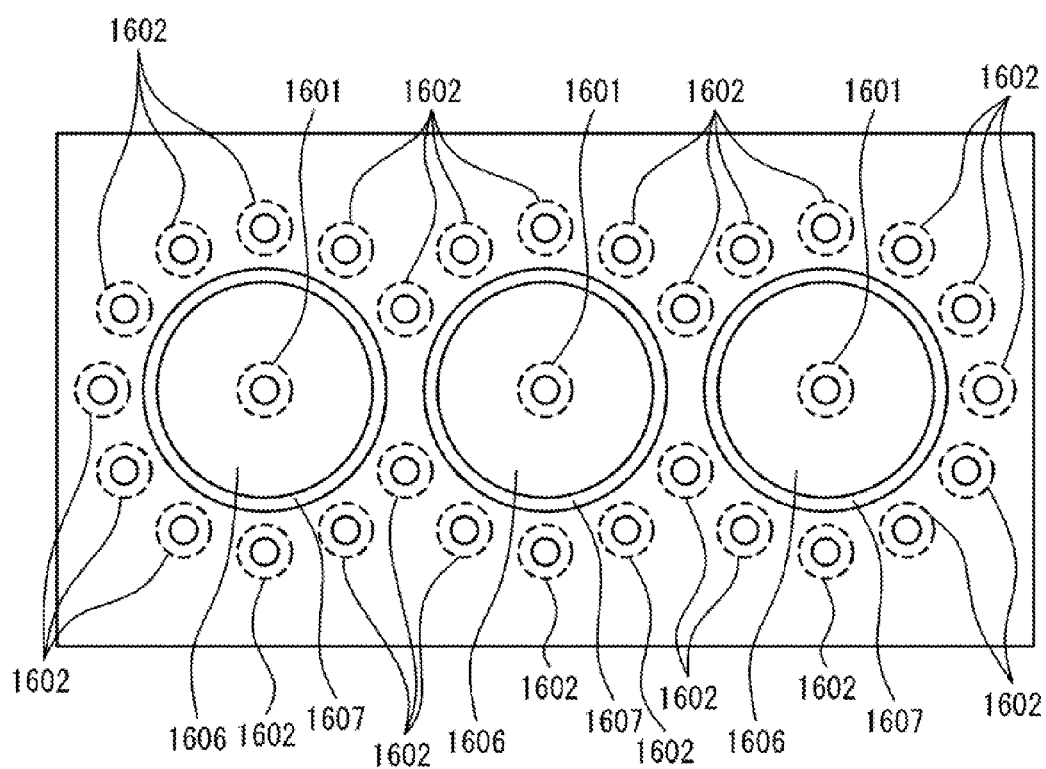
FIG. 16D is a horizontal cross-sectional view of the filter shown in FIG. 16A on 16D-16D section.
Figure 16E:
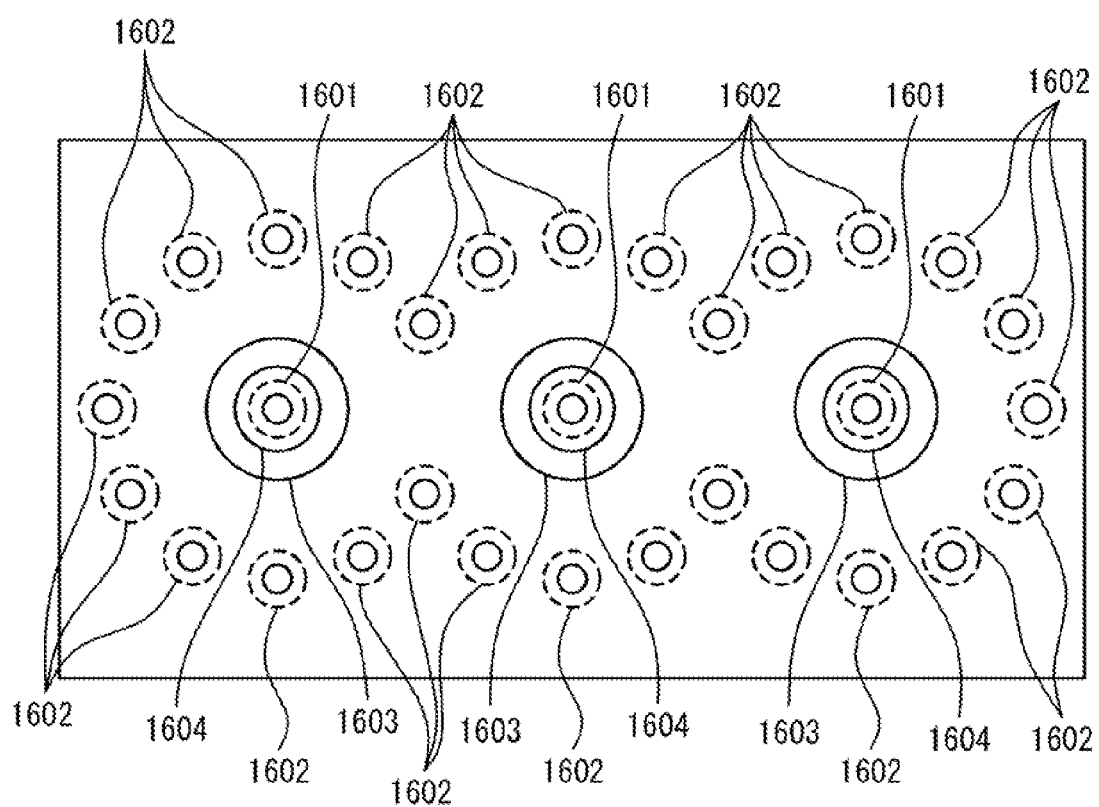
FIG. 16E is a top view of the filter shown in FIG. 16A.
Figure 16F:
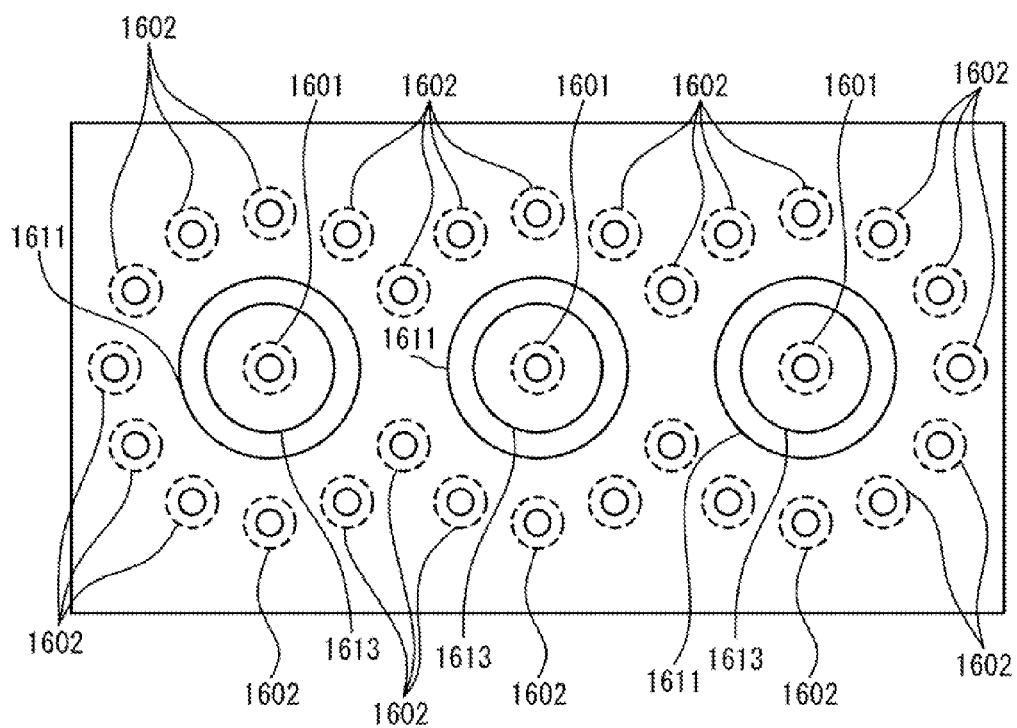
FIG. 16F is a bottom view of the filter shown in FIG. 16A.
Figure 17B:
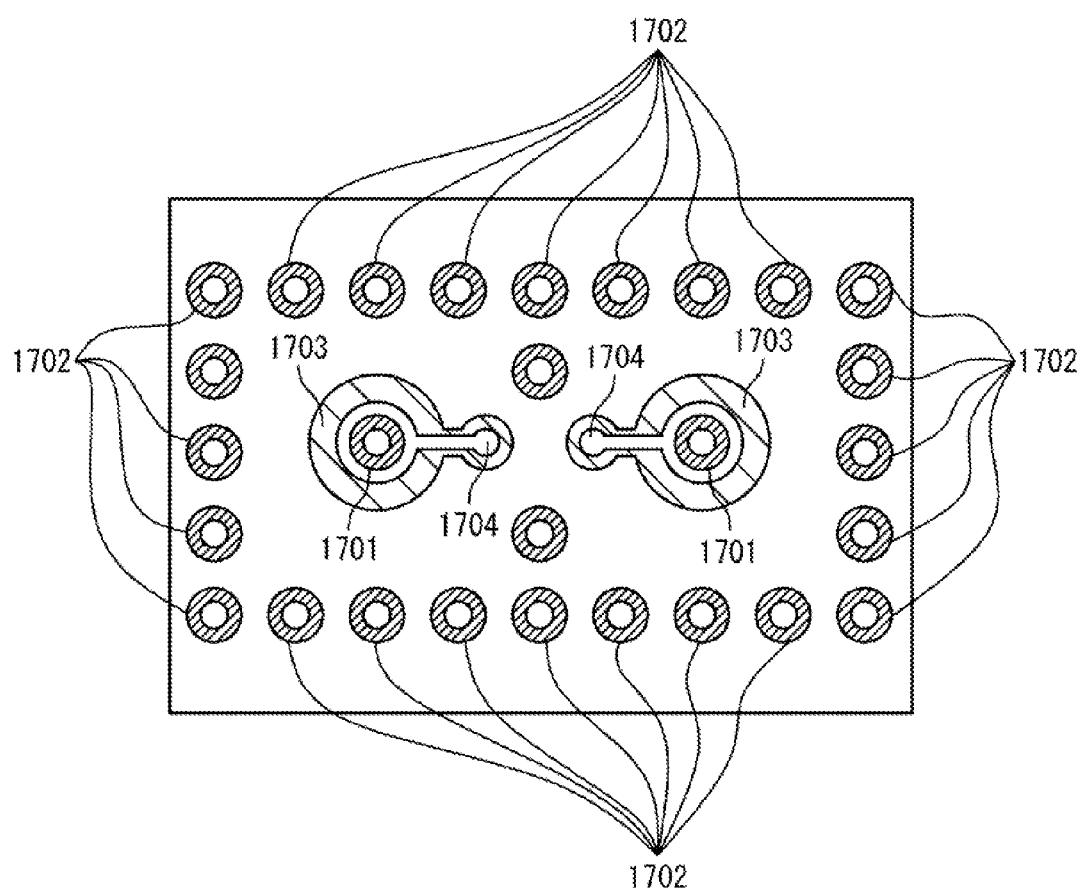
FIG. 17B is a horizontal cross-sectional view of the filter shown in FIG. 17A on 17B-17B section.
Figure 17C:
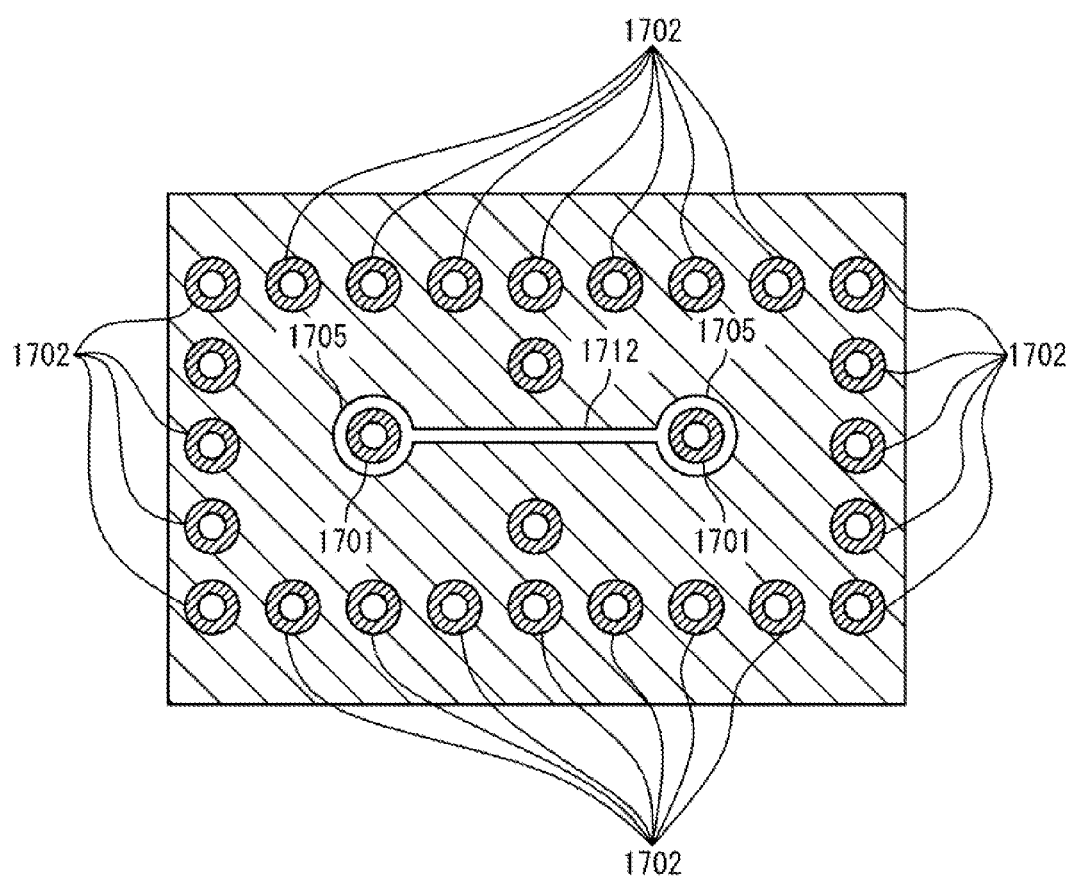
FIG. 17C is a horizontal cross-sectional view of the filter shown in FIG. 17A on 17C-17C section.
Figure 17D:
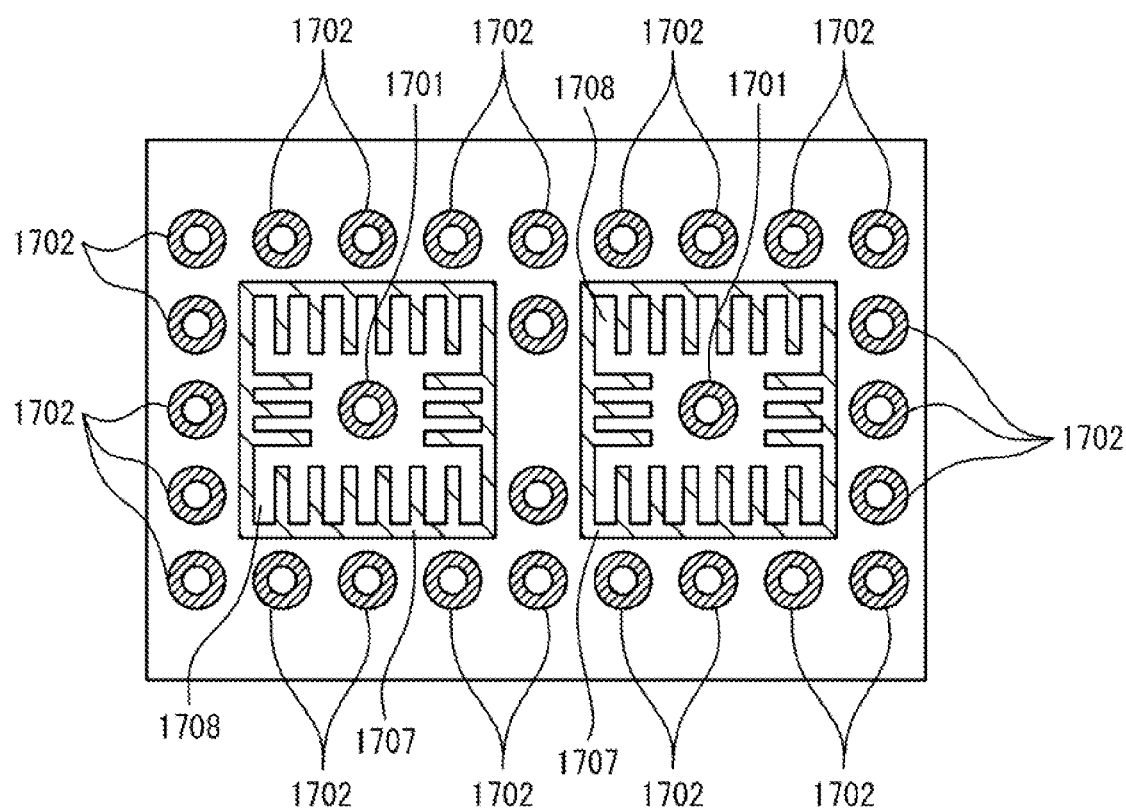
FIG. 17D is a horizontal cross-sectional view of the filter shown in FIG. 17A on 17D-17D section.
Figure 17E:
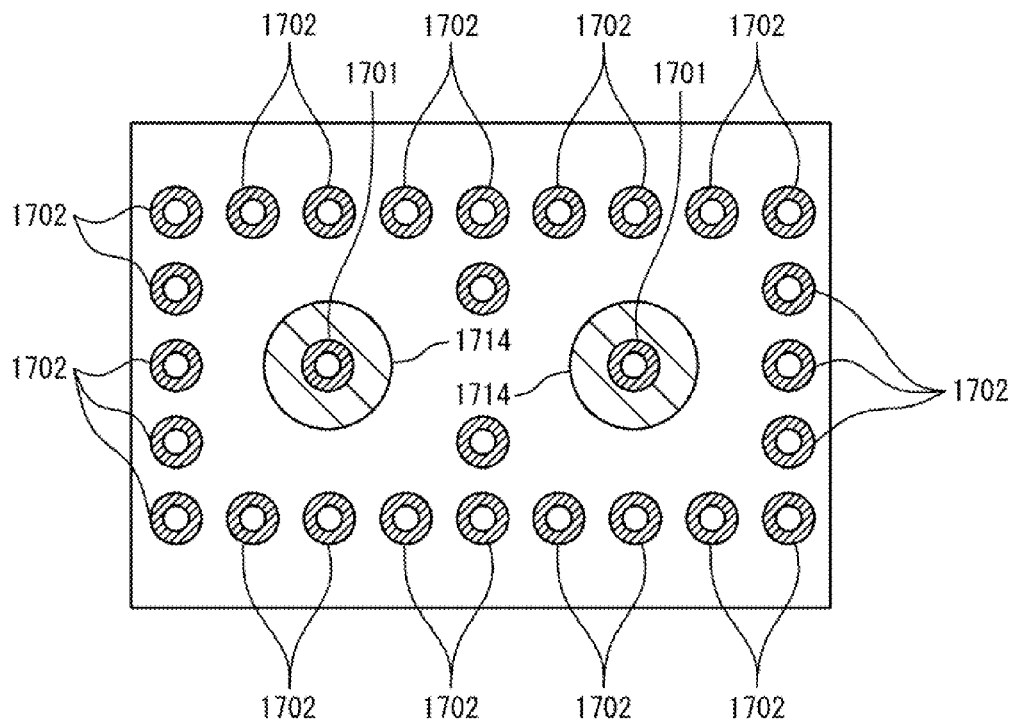
FIG. 17E is a horizontal cross-sectional view of the filter shown in FIG. 17A on 17E-17E section.
Figure 17F:
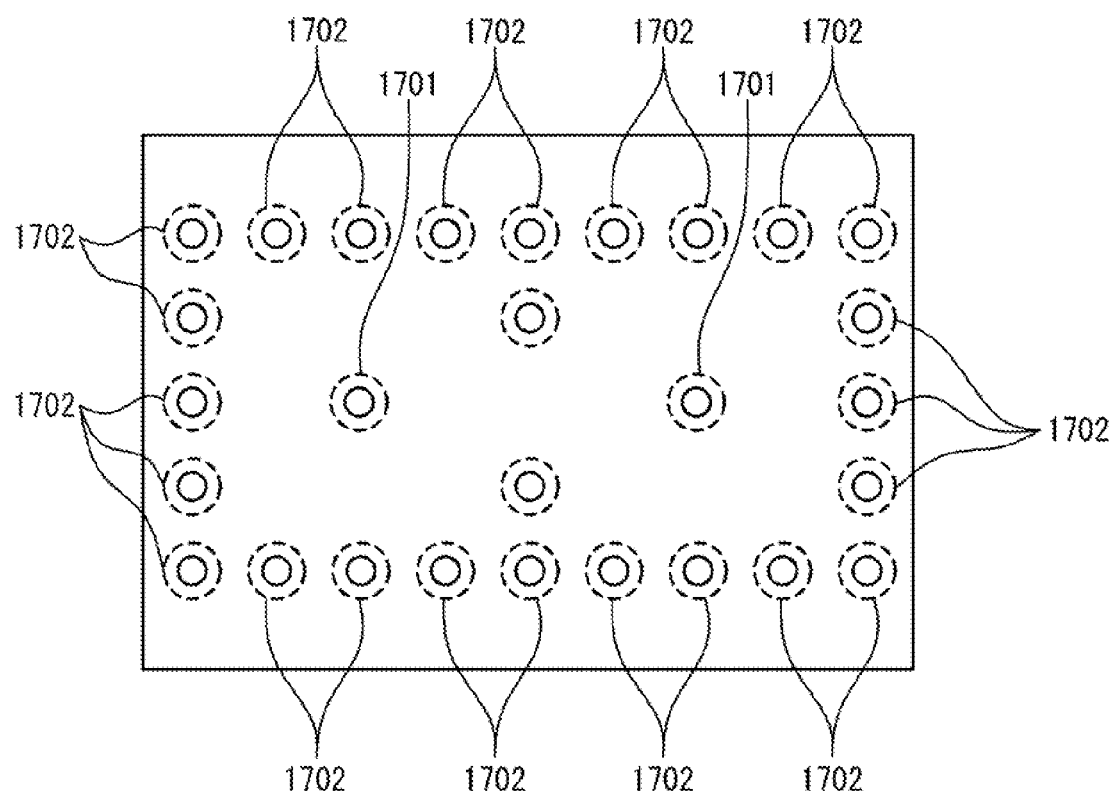
FIG. 17F is a bottom view of the filter shown in FIG. 17A.

It should be noted that all vertical cross-section view in aforementioned figures are taken in the similar manner as shown in FIGS. 15C and 17B.

While the present invention has been described in relation to some exemplary embodiments, it is to be understood that these exemplary embodiments are for the purpose of description by example, and not of limitation. While it will be obvious to those skilled in the art upon reading the present specification that various changes and substitutions may be easily made by equal components and art, it is obvious that such changes and substitutions lie within the true scope and spirit of the presented invention as defined by the claims.

The invention claimed is:

1. A filter comprising:
a planar transmission line; and
a plurality of combined via structures,
wherein said planar transmission line and said plurality of combined via structures are disposed in a multilayer board,
wherein each of said plurality of combined via structures comprises a first working part and a second working part,
wherein the first working part comprises:
a first pad disposed at one side of said multilayer board;
a connection pad embedded in said multilayer board;
a first segment of a signal via in which one end and another end are respectively connected to said first pad and said connection pad;
a plurality of first segments of ground vias surrounding said first segment of the signal via;
a first plurality of ground planes connected to said plurality of first segments of ground vias; and
a first clearance region isolating said first pad, said connection pad and said first segment of the signal via from said first plurality of ground planes,
wherein the second working part comprises:
a second pad disposed at another side of said multilayer board;
a second segment of the signal via in which one end is jointed to said connection pad and another end is jointed to said second pad;
a single corrugated conductive plate connected to said second segment of the signal via;
a plurality of second segments of ground vias surrounding said second segment of the signal via and jointed to said plurality of first segments of ground vias;
a second plurality of ground planes connected to said plurality of second segments of ground vias wherein one ground plane among said second plurality of ground planes is disposed at said another side of said multilayer board;
a second clearance region isolating said second pad from said one ground plane disposed at said another side of said multilayer board; and
an isolating slit separating said single corrugated conductive plate from a second ground plane of said second plurality of ground planes disposed at the same conductor layer as said single corrugated conductive plate,
wherein said connection pad of a first one combined via structure of said plurality of combined via structures and said connection pad of a second one combined via structure of said plurality of combined via structures are respectively jointed to a first end and a second end of said planar transmission line, and
wherein said first pad of said first combined via structure and said first pad of said second combined via structure act as terminals of said filter.

2. The filter according to claim 1, wherein said corrugated conductive plate is corrugated partially.

3. The filter according to claim 2, wherein said second working part beside said corrugated plate comprises a smooth conductive plate separated from a third ground plane of said second plurality of ground planes disposed at the same conductor layer as said smooth conductive plate by an isolating slit.

4. The filter according to claim 3,
wherein said planar transmission line comprises a plurality of segments connected in series and having a same length,
wherein said at least two combined via structures are periodically disposed along said planar transmission line on each end of said plurality of segments,
wherein said plurality of combined via structures are connected to said plurality of segments by means of a connection pad,
wherein each of said plurality of combined via structures serves as an elementary cell of said filter, and
wherein said first pads of said plurality of combined via structures which have only one connection to said plurality of segments of said planar transmission line serve as terminals of said filter.

5. A filter comprising:
a planar transmission line; and
a plurality of combined via structures,
wherein said planar transmission line and said plurality of combined via structures are disposed in a multilayer board, wherein each of said plurality of combined via structures comprises a first working part and a second working part,
wherein the first working part comprises:
  a first pad disposed at one side of said multilayer board;
  a connection pad embedded in said multilayer board;
  a first segment of a signal via in which one end and another end are respectively connected to said first pad and said connection pad;
  a plurality of first segments of ground vias surrounding said first segment of the signal via;
  a first plurality of ground planes connected to said plurality of first segments of ground vias; and
  a first clearance region isolating said first pad, said connection pad and said first segment of the signal via from said first plurality of ground planes,
wherein the second working part comprises:
  a second pad disposed at another side of said multilayer board;
  a second segment of the signal via in which one end is jointed to said connection pad and another end is jointed to said second pad;
  a single corrugated conductive plate connected to said second segment of the signal via;
  a plurality of second segments of ground vias surrounding said second segment of the signal via and jointed to said plurality of first segments of ground vias;
  a second plurality of ground planes connected to said plurality of second segments of ground vias wherein one ground plane among said second plurality of ground planes is disposed at said another side of said multilayer board; and
  an isolating slit separating said single corrugated conductive plate from a second ground plane of said second plurality of ground planes disposed at the same conductor layer as said single corrugated conductive plate,
wherein said connection pad of a first one combined via structure of said plurality of combined via structures and said connection pad of a second one combined via structure of said plurality of combined via structures are respectively jointed to a first end and a second end of said planar transmission line,
wherein said first pad of said first combined via structure and said first pad of said second combined via structure act as terminals of said filter, and
wherein said second pad of said second working part of said each combined via structure of said plurality of combined via structures is connected to said one ground plane disposed at said another side of said multilayer board.

6. The filter according to claim 5, wherein corrugations in said corrugated conductive plate are oriented in parallel to the direction of said planar transmission line.

7. The filter according to claim 6, wherein said corrugated conductive plate is corrugated partially.

8. The filter according to claim 5, wherein corrugations in said corrugated conductive plate are oriented perpendicular to the direction of said planar transmission line.

9. The filter according to claim 8, wherein said corrugated conductive plate is corrugated partially.

10. A filter comprising:
a planar transmission line; and
a plurality of combined via structures,
wherein said planar transmission line and said plurality of combined via structures are disposed in a multilayer board,
wherein each of said plurality of combined via structures comprises a first working part and a second working part,
wherein the first working part comprises:
  a first pad disposed at one side of said multilayer board;
  a connection pad embedded in said multilayer board;
  a first segment of a signal via in which one end and another end are respectively connected to said first pad and said connection pad;
  a plurality of first segments of ground vias surrounding said first segment of the signal via;
  a first plurality of ground planes connected to said plurality of first segments of ground vias; and
  a first clearance region isolating said first pad, said connection pad and said first segment of the signal via from said first plurality of ground planes,
wherein the second working part comprises:
  a second pad disposed at another side of said multilayer board;
  a second segment of the signal via in which one end is jointed to said connection pad and another end is jointed to said second pad;
  a single corrugated conductive plate connected to said second segment of the signal via;
  a plurality of second segments of ground vias surrounding said second segment of the signal via and jointed to said plurality of first segments of ground vias;
  a second plurality of ground planes connected to said plurality of second segments of ground vias wherein one ground plane among said second plurality of ground planes is disposed at said another side of said multilayer board; and
  an isolating slit separating said single corrugated conductive plate from a second ground plane of said second plurality of ground planes disposed at the same conductor layer as said single corrugated conductive plate,
wherein said connection pad of a first one combined via structure of said plurality of combined via structures and said connection pad of a second one combined via structure of said plurality of combined via structures are respectively jointed to a first end and a second end of said planar transmission line,
wherein said first pad of said first combined via structure and said first pad of said second combined via structure act as terminals of said filter,
wherein said second pad is connected to said one ground plane disposed at said another side of said multilayer board, and
wherein corrugations in said corrugated conductive plate are oriented in both perpendicular and parallel to the direction of said planar transmission line.

11. The filter according to claim 10, wherein said corrugated conductive plate is corrugated partially.

12. The filter according to claim 11, wherein said second working part beside said corrugated plate comprises a smooth conductive plate separated from a third ground plane of said second plurality of ground planes disposed at the same conductor layer as said smooth conductive plate by an isolating slit.

13. The filter according to claim 12,
wherein said planar transmission line comprises a plurality of segments connected in series and having a same length,
wherein said at least two combined via structures are periodically disposed along said planar transmission line on each end of said plurality of segments, wherein said plurality of combined via structures are connected to said plurality of segments by means of connection pad,
wherein each of said plurality of combined via structures serves as an elementary cell of said filter, and
wherein said first pads of said plurality of combined via structures which have only one connection to said plurality of segments of said planar transmission line serve as terminals of said filter.

14. The filter according to claim 13 wherein each of said terminals is connected to a planar transmission line to integrate said filter into a system.

15. A combined via structure comprising:
a first working part disposed in a multilayer board; and
a second working part disposed in said multilayer board under said first working part,
wherein said multilayer board comprises a plurality of conductor layers isolated by a dielectric material,
wherein said first working part comprises:
  a first pad disposed at one side of said multilayer board;
  a connection pad embedded in said multilayer board;
  a first segment of a signal via in which one end and another end are respectively connected to said first pad and said connection pad;
  a plurality of first segments of ground vias surrounding said first segment of the signal via;
  a first plurality of ground planes connected to said plurality of first segments of ground vias; and
  a first clearance region isolating said first pad, said connection pad and said first segment of the signal via from said first plurality of ground planes,
wherein said second working part comprises:
  a second pad disposed at another side of said multilayer board;
  a second segment of said signal via in which one end is jointed to said connection pad and another end is jointed to said second pad;
  a single corrugated conductive plate connected to said second segment of said signal via;
  a plurality of second segments of ground vias surrounding said second segment of said signal via and jointed to said plurality of first segments of ground vias;
  a second plurality of ground planes connected to said plurality of second segments of ground vias wherein one ground plane among said second plurality of ground planes is disposed at said another side of said multilayer board;
  a second clearance region isolating said second pad from said one ground plane disposed at said another side of said multilayer board; and
  an isolating slit separating said single corrugated conductive plate from a second ground plane of said second plurality of ground planes disposed at the same conductor layer as said corrugated conductive plate; and
  wherein corrugations in said single corrugated conductive plate serve to improve out-of-band noise suppression for a filter in which said combined via structure is applied as a resonant element and to control the bandwidth said filter without an additional resonant element.

16. A combined via structure comprising:
a first working part disposed in a multilayer board; and
a second working part disposed in said multilayer board under said first working part,
wherein said multilayer board comprises a plurality of conductor layers isolated by a dielectric material,
wherein said first working part comprises:
  a first pad disposed at one side of said multilayer board;
  a connection pad embedded in said multilayer board;
  a first segment of a signal via in which one end and another end are respectively connected to said first pad and said connection pad;
  a plurality of first segments of ground vias surrounding said first segment of the signal via;
  a first plurality of ground planes connected to said plurality of first segments of ground vias; and
  a first clearance region isolating said first pad, said connection pad and said first segment of the signal via from said first plurality of ground planes,
wherein said second working part comprises:
  a second pad disposed at another side of said multilayer board;
  a second segment of said signal via in which one end is jointed to said connection pad and another end is jointed to said second pad;
  a single corrugated conductive plate connected to said second segment of said signal via;
  a plurality of second segments of ground vias surrounding said second segment of said signal via and jointed to said plurality of first segments of ground vias;
  a second plurality of ground planes connected to said plurality of second segments of ground vias wherein one ground plane among said second plurality of ground planes is disposed at said another side of said multilayer board; and
  an isolating slit separating said corrugated conductive plate from a second ground plane of said second plurality of ground planes disposed at the same conductor layer as said corrugated conductive plate,
wherein said second pad of said second working part of said combined via structure is connected to said one ground plane disposed at said another side of said multilayer board; and
wherein corrugations in said single corrugated conductive plate serve to improve out-of-band noise suppression for a filter in which said combined via structure is applied as a resonant element and to control the bandwidth said filter without an additional resonant element.

17. A filter comprising:
a planar transmission line; and
a plurality of combined via structures,
wherein said planar transmission line and said plurality of combined via structures are disposed in a multilayer board,
wherein each of said plurality of combined via structures comprises a first working part and a second working part,
wherein the first working part comprises:
  a first pad disposed at one side of said multilayer board;
  a connection pad embedded in said multilayer board;
  a first segment of a signal via in which one end and another end are respectively connected to said first pad and said connection pad;
  a plurality of first segments of ground vias surrounding said first segment of the signal via;
  a first plurality of ground planes connected to said plurality of first segments of ground vias; and
  a first clearance region isolating said first pad, said connection pad and said first segment of the signal via from said first plurality of ground planes,
wherein the second working part comprises:

a second pad disposed at another side of said multilayer board;

a second segment of the signal via in which one end is jointed to said connection pad and another end is jointed to said second pad;

a single corrugated conductive plate connected to said second segment of the signal via;

a plurality of second segments of ground vias surrounding said second segment of the signal via and jointed to said plurality of first segments of ground vias;

a second plurality of ground planes connected to said plurality of second segments of ground vias wherein one ground plane among said second plurality of ground planes is disposed at said another side of said multilayer board; and an isolating slit separating said single corrugated conductive plate from a second ground plane of said second plurality of ground planes disposed at the same conductor layer as said single corrugated conductive plate, wherein said connection pad of a first one combined via structure of said plurality of combined via structures and said connection pad of a second one combined via structure of said plurality of combined via structures are respectively jointed to a first end and a second end of said planar transmission line, wherein said first pad of said first combined via structure and said first pad of said second combined via structure act as terminals of said filter, wherein said second pad is connected to said one ground plane disposed at said another side of said multilayer board, wherein corrugations in said corrugated conductive plate are oriented in parallel to the direction of said planar transmission line, wherein said corrugated conductive plate is corrugated partially, and wherein said second working part beside said corrugated plate comprises a smooth conductive plate separated from a third ground plane of said second plurality of ground planes disposed at the same conductor layer as said smooth conductive plate by an isolating slit.

18. The filter according to claim 17, wherein said planar transmission line comprises a plurality of segments connected in series and having a same length, wherein said at least two combined via structures are periodically disposed along said planar transmission line on each end of said plurality of segments, wherein said plurality of combined via structures are connected to said plurality of segments by means of connection pad, wherein each of said plurality of combined via structures serves as an elementary cell of said filter, and wherein said first pads of said plurality of combined via structures which have only one connection to said plurality of segments of said planar transmission line serve as terminals of said filter.

19. A filter comprising:

a planar transmission line; and a plurality of combined via structures, wherein said planar transmission line and said plurality of combined via structures are disposed in a multilayer board, wherein each of said plurality of combined via structures comprises a first working part and a second working part, wherein the first working part comprises:

a first pad disposed at one side of said multilayer board;

a connection pad embedded in said multilayer board;

a first segment of a signal via in which one end and another end are respectively connected to said first pad and said connection pad;

a plurality of first segments of ground vias surrounding said first segment of the signal via;

a first plurality of ground planes connected to said plurality of first segments of ground vias; and a first clearance region isolating said first pad, said connection pad and said first segment of the signal via from said first plurality of ground planes, wherein the second working part comprises:

a second pad disposed at another side of said multilayer board;

a second segment of the signal via in which one end is jointed to said connection pad and another end is jointed to said second pad;

a single corrugated conductive plate connected to said second segment of the signal via;

a plurality of second segments of ground vias surrounding said second segment of the signal via and jointed to said plurality of first segments of ground vias;

a second plurality of ground planes connected to said plurality of second segments of ground vias wherein one ground plane among said second plurality of ground planes is disposed at said another side of said multilayer board; and an isolating slit separating said single corrugated conductive plate from a second ground plane of said second plurality of ground planes disposed at the same conductor layer as said single corrugated conductive plate, wherein said connection pad of a first one combined via structure of said plurality of combined via structures and said connection pad of a second one combined via structure of said plurality of combined via structures are respectively jointed to a first end and a second end of said planar transmission line, wherein said first pad of said first combined via structure and said first pad of said second combined via structure act as terminals of said filter, wherein said second pad is connected to said one ground plane disposed at said another side of said multilayer board, wherein corrugations in said corrugated conductive plate are oriented perpendicular to the direction of said planar transmission line, wherein said corrugated conductive plate is corrugated partially, and wherein said second working part beside said corrugated plate comprises a smooth conductive plate separated from a third ground plane of said second plurality of ground planes disposed at the same conductor layer as said smooth conductive plate by an isolating slit.

20. The filter according to claim 19, wherein said planar transmission line comprises a plurality of segments connected in series and having a same length, wherein said at least two combined via structures are periodically disposed along said planar transmission line on each end of said plurality of segments, wherein said plurality of combined via structures are connected to said plurality of segments by means of a connection pad, wherein each of said plurality of combined via structures serves as an elementary cell of said filter, and wherein said first pads of said plurality of combined via structures which have only one connection to said plurality of segments of said planar transmission line serve as terminals of said filter.

\* \* \* \* \*